(12) United States Patent  
Li

(10) Patent No.: US 7,118,942 B1  
(45) Date of Patent: Oct. 10, 2006

(54) METHOD OF MAKING ATOMIC INTEGRATED CIRCUIT DEVICE

(76) Inventor: Chou H. Li, 1 Oak Bend Rd., West Orange, NJ (US) 07052

( * ) Notice: Subject to any disclaimer, the term of this patent is extended or adjusted under 35 U.S.C. 154(b) by 80 days.

(21) Appl. No.: 10/630,115

(22) Filed: Jul. 29, 2003

Related U.S. Application Data

(63) Continuation-in-part of application No. 09/670,571, filed on Sep. 27, 2000, now Pat. No. 6,599,781, and application No. 09/670,874, Sep. 27, 2000, now Pat. No. 6,784,515.

(51) Int. Cl.  
*H01L 21/335* (2006.01)

(52) U.S. Cl. ............... 438/142; 438/22; 438/24; 438/27; 438/421; 257/9; 257/140; 257/146; 257/496; 257/510

(58) Field of Classification Search ............ None  
See application file for complete search history.

(56) References Cited

U.S. PATENT DOCUMENTS

| | | | |
|---|---|---|---|
| 2,788,298 A | 4/1957 | Clarke | |
| 2,795,742 A | 6/1957 | Pfann | |
| 2,813,048 A | 11/1957 | Pfann | |
| 2,815,304 A | 12/1957 | Gudmundsen | |
| 2,890,395 A | 6/1959 | Lathrop et al. | |
| 2,899,343 A | 8/1959 | Statz | |
| 2,973,290 A | 2/1961 | Mlavsky | |
| 3,015,762 A | 1/1962 | Shockley | |
| 3,076,104 A | 1/1963 | Miller | |
| 3,081,418 A | 3/1963 | Manintveld | |
| 3,098,160 A | 7/1963 | Noyco | |
| 3,100,276 A | 8/1963 | Meyer | |
| 3,124,452 A | 3/1964 | Kraft | |
| 3,132,057 A | 5/1964 | Greenberg | |
| 3,142,021 A | 7/1964 | Stelmak | |
| 3,150,017 A | 9/1964 | Ezakl | |
| 3,159,780 A | 12/1964 | Perks | |
| 3,192,082 A | 6/1965 | Toronto et al. | |
| 3,200,311 A | 8/1965 | Thomas et al. | |
| 3,200,468 A | 8/1965 | Dehlberg | |
| 3,209,428 A | 10/1965 | Barbaro | |
| 3,216,871 A | 11/1965 | Kool et al. | |
| 3,226,225 A | 12/1965 | Weiss | |
| 3,226,268 A | 12/1965 | Bernard | |
| 3,230,609 A | 1/1966 | Kool et al. | |
| 3,233,305 A | 2/1966 | Dill | |
| 3,235,779 A | 2/1966 | Zacharellia | |
| 3,237,062 A | 2/1966 | Murphy | |
| 3,247,428 A | 4/1966 | Pearl et al. | |
| 3,252,062 A | 5/1966 | Kool | |
| 3,255,035 A | 6/1966 | Ross | |
| 4,890,783 A * | 1/1990 | Li | 228/122.1 |
| 5,161,728 A * | 11/1992 | Li | 228/124.1 |
| 5,874,175 A * | 2/1999 | Li | 428/457 |
| 6,150,242 A * | 11/2000 | Van der Wagt et al. | 438/481 |

* cited by examiner

*Primary Examiner*—Andy Huynh  
(74) *Attorney, Agent, or Firm*—Hall, Vande Sands and Pequinot

(57) ABSTRACT

A method of mass-producing a solid state device comprises providing an atomically smooth, solid state material layer no more than 40 Angstroms thick. This layer is uniformly and defect-freely bonded onto a substrate to provide an acceptable device yield.

54 Claims, 3 Drawing Sheets

METHOD OF MAKING ATOMIC INTEGRATED CIRCUIT DEVICE

CROSS REFERENCE TO RELATED APPLICATIONS

This application is a continuation-in-part of application Ser. No. 09/670,571 filed on Sep. 27, 2000, now U.S. Pat. No. 6,599,781; and also of application Ser. No. 09/670,874 filed on Sep. 27, 2000.

BACKGROUND OF THE INVENTION

The invention relates to methods of making atomic integrated circuit devices and more particularly to methods of making improved, miniaturized atomic semiconductor integrated circuit devices.

1. Field of the Invention

The invention relates to methods of making solid state integrated circuit devices and more particularly to methods of making improved, miniaturized semiconductor integrated circuits devices.

2. Background of the Invention

Shockley, Bardeen, and Brattain invented the transistor around 1950 and started the modern electronics age. Kilby and Noyce next combined active and passive components on a single chip and invented the integrated circuit. But even only several components were combined, the yield was low. Fairchild's Isoplanar technology (FIG. 1) made possible medium-scale and larger-scale integrated circuits in 1972 according to Peltzer's U.S. Pat. No. 3,648,125. Simultaneously, other similar dielectric isolation processes, such as Kooi's LOCOS (i.e., local oxide isolation technology) of Philip and Magdos's oxide-recessed technology of IBM, were also widely used.

In a 1976 four-party Interference No. 98,426, Li for his application Ser. No. 154,300 on round-bottomed isolating oxide groove was considered as the "Senior-most Inventor" having an effective filing date of Sep. 23, 1986 among Fairchild's Peltzer, Philip's Kooi, and IBM's Magdo and Magdo.

According to Peltzer's patent, the Fairchild's Isoplanar device 40 as typified by FIG. 1 in his '125 patent has a n-type epitaxial silicon layer 42 formed on a p-type substrate 41. Oxide isolating regions, e.g., 44a, 44b, 44c and 44d are used to isolate the different components. Each of these oxide isolating regions has a wide central flat bottom each occupying much of the chip real estate and producing unnecessarily larger devices.

Li's round-bottomed isolating oxide groove 21 of FIG. 2 was conceived on September 23, column 12, lines 72–75 1968 as shown in his U.S. Pat. No. 3,585,714, column 12, lines 72–75. In the application Ser. No. 154,300, this device is shown to improve device leakage current and breakdown voltage. Also, the groove bottom G of zero width eliminates the wasted chip real estate of all other existing devices of, e.g., Isoplanar, LOCOS, and oxide-recessed types.

This unique rounding feature not only produces smaller devices, but also give rounded PN junction region peripheral surface minimizing contamination by micron-size or even atomic particles thereby increasing yield. See FIG. 2. The smaller the device size, the more critical this yield factor.

Specifically, the rounded groove 21 produces a curved, exposed peripheral junction surface preventing contamination by rubbing contacts with dust particles. Such contacts form, e.g., metallic shorting paths and drastically reduce the device yield by increasing leakage current and decreasing breakdown voltage. Li's U.S. Pat. No. 3,430,109 discloses at column 5, lines 15–20 that for a one-micron (thick) PN junction region, a single-atomic gold chain on-micron long contains 3,903 gold atoms giving a leakage current of 0.15 ma at 50 volts thereby destroying the device. A single 1-micron gold particle could possibly destroy $7.977 \times 10^6$ particles.

Knowing the problem, the solution is very simple yet critical—groove rounding and the cleaning room. Modern devices have much thinner junction regions so that the same 1-micron gold particle could now destroy over 1 billion devices!

In the patent application Ser. No. 154,300, the device of FIG. 2 is made by thermally growing an oxide groove, band, or material region 21 transversely into a p-type silicon substrate 22. This is followed by oxide-guided, maskless diffusion of n-type dopants from the top surface 23 to give the top n-type silicon layer 24 and the new PN junction region 25. The rounded bottom G has a zero bottom width.

All these devices can still be improved, both in performance and device size. While retaining the rounded bottom feature, the oxide isolating regions or field layers in this present invention are further narrowed down to even one or two atomic layers occupying the minimum chip real estate. The present invention thus provides still better and further miniaturized solid-state integrated circuits (IC) in general and semiconductor integrated circuits in particular.

Specifically, this invention will address the following issues:

1) improving the critical gate layer material and structure;
2) reducing the insulating field oxide region size by orders of magnitude from microns to angstroms;
3) making the entire device more resistant to temperature, stress, impact, vibration, and high-gravity (G) forces due to rapid accelerations and decelerations;
4) simplifying device material inventories and manufacturing process;
5) providing a new type of high-performance flexible circuits;
6) designing 1-D (one-dimensional), 2-D, and 3-D atomic or molecular diode or transistor arrays or IC especially useful for supercomputers and electro-optical telecommunications; and
7) producing new atomic or molecular IC operating selectively in a single-electron, single-hole, single-carrier, or single-photon mode.

The devices of the invention may use different solid-state or semiconductor materials including Si, Ge, Si—Ge, InP, GaAs, SiC, InAs, InAlP, superconductor, diamond, and periodic group III–V or II–VI semiconductors. In this invention, Si semiconductor materials are exclusively used by way of illustration. Also, metal-oxide-semiconductor (MOS) or, in general, and conductor-insulator-semiconductor (CIS) devices, and single-electron, single-hole, single-carrier, and single-photon IC with silicon dioxide gate and field layers are used exclusively as examples in this specification.

Other types of solid-state devices in general and semiconductor devices in particular can also use this invention. Specifically, electro optical, superconductor, magnetic, ferro electric memory, electrooptomagnetic, single-electron, single-hole, single-carrier, single-photon IC, and other solid-state devices can also be designed according to principles of this invention.

The "heart" of the transistor is the gate dielectric layer, where most electronic actions and the associated heating or degradations occur. The gate oxide dielectric is the smallest but a most critical feature of the transistor. It lies between the transistor's gate electrode, which turns current flow, and the silicon channel through which the current flows. The gate oxide insulates and protects the channel from the gate electrode preventing short circuits. Shrinking this gate oxide layer allows more current out of the switch with less voltage.

More than any other part of the structure, this gate layer determines the device performance and reliability. Many think that this insulating layer would be the limiting factor for producing increasingly smaller chips.

The thickness of gate oxides is the subject of intense research and development worldwide. Bell Laboratory scientists have created a 5-atom silicon dioxide layer that include a 1-atom transition layer between this layer and the substrate. A rapid thermal oxidation technique was used using pure oxygen at 1,000° C. for 10 seconds. Oxides less than 6 angstroms or 3 atoms have been made, but the leakage current was not manageable. Additional reliability issues included adhesion loss, texture, thermally or mechanically induced cracking, moisture adsorption, step coverage, and time-dependent behavior on, e.g., thermal conductivity and breakdown voltage. The reduced mechanical strength is critical in both packaging and processing such as during chemical-mechanical polishing.

Traditionally, the gate dielectric has been—and it still is—a thermally grown layer of silicon dioxide ($SiO_2$) averaged about 25 atoms thick. By continually reducing the gate oxide thickness and the length of the gate electrode, the semiconductor industry has doubled the transistor's switching speed every 18 to 24 months according to the Moore's Law.

This has worked remarkably well, but problems exist. One is that the oxide often permits boron penetration from the gate into the threshold region, degrading the threshold voltage and device performance. The other problem is that as device size shrinks, the gate oxide becomes so thin that "tunneling" currents arise from the gate through the oxide to the substrate, again degrading the device performance.

To overcome the first problem, transistor engineers have developed solutions involving stacked gates and various nitridation techniques. Nitradation adds nitrogen to the silicon dioxide. A successful two-step oxidation/nitridation approach using a sequential in situ steam generation and rapid plasma nitridation process shows a 5–7× reduction in leakage current compared to $SiO_2$ at an effective oxide thickness of less than 20 A (or Angstroms).

The second problem relates to current tunneling through very thin oxides. This problem is more difficult and thought to require a change of materials. The tunneling current rises very quickly as the oxide is thinned down. It is believed that below about 14–15 A, new material must be used to replace the silicon dioxide. One would look for a thinner but defect-free $SiO_2$ film to avoid the excessive leakage current. The new high-k materials must be used in place of the 14–15 A $SiO_2$ layers. Some solutions are possible, but none fit all needs.

The new insulating material must also have the right dielectric constant and be compatible chemically with silicon to get the right interface. Interface micro or atomic engineering may in fact be the key factor that will allow the new or old materials to continue the scaling of field-effect transistors (FET).

The defect-free gate dielectric layer must be put down uniformly in a thin film to tolerate subsequent silicon processing and temperature cycling. There is still no suitable high dielectric constant material and interface layer with the stability and interface characteristics to serve as a gate dielectric.

Metal silicates may be good candidates. Halfnium and zirconium silicates are stable in contact with silicon, between substrate and dielectric. Tantalum pentoxide is also available.

Even with a material other than $SiO_2$, a very thin $SiO_2$ layer will probably still be required at the channel and/or gate electrode interface to preserve interface state characteristics and channel mobility. A major problem with a material other than $SiO_2$ is the probability that a very thin $SiO_2$ layer will still be required at the channel and/or gate electrode interface to preserve interface state characteristics and channel mobility. This would severely reduce any benefits due to the high-k dielectric.

It has been suggested that the first 10 A above the silicon substrate largely determine the leakage properties of the dielectric and the carrier mobilities in the channel underneath. Once past that, only the bulk properties of the film needs to be dealt with. Controlling these properties will be critical to the success of high-k materials. Some hope exists to shrink the silicon dioxide down to 0.1 um (or microns) thick using plasma nitridation to control the first 10 A or so of the dielectric.

The gate material is often a doped poly-silicon with a silicide on top. Interest exists in switching the polysilicon to a metal due to depletion effects associated with the poly. When the device is turned on, the poly-silicon actually depletes a little bit making it look like a thicker oxide. This depletion effect leads to less drive current—a characteristic of a semiconductor material rather than a metal.

The now used high dielectric (k) material is moving from the doped polysilicon to a metal. The advantage of metal gates is that this depletion effect is avoided, and the gate resistance is lowered. However, there are two disadvantages to metal gates. The metal work function of the gate is fixed by the choice of metal. By comparison, the work function in poly-silicon is controllable by varying doping of either n-type or p-type material. This allows optimization of the threshold voltages for both the n-channel and p-channel transistor, not possible with metal.

The main focus of present transistor engineering effort is to maximize the drive current. The present transistor is a current source charging a large capacitor. The higher the current source and the smaller the capacitance, the faster it charges. All the industry's scaling efforts are towards improving the drive current at lower voltages. Second to optimizing drive current is a need to reduce parasitic capacitances at the device levels and the interconnect level. Hence, high-k material for the gate electrode dielectric is moving from doped poly-silicon to a metal.

Sixteen (16) ion implantation steps are commonly used to create the sources and drains for the PMOS and NMOS devices, and the retrograde wells in which they sit. Implantation is also used to dope the gate and to provide the "punch-through stop" pockets. After the implantation, the device must be annealed at a relatively high temperature to remove the implantation damages, to "activate" the dopants, and to insure that all dopant atoms lie exactly where needed.

The junction depth for source/drains should be only 35–70 nm deep for the 100 nm (or 0.1 um) generation due to go into production in 2005. Drain extensions should only be 20–33 nm deep. The abruptness of the source and drain extensions is critical. There are still no known solutions in several areas.

Many believe computer modeling will help researchers determine the optimal doping profile and study the impact of various process parameters on dopant diffusion. A few degrees in temperature can have a significant effect on the doping profiles. Aggressive scaling of the transistor source/drain junction depth requires production worthy (milliamperes for 300 nm wafers) ion beam current at sub-Kev energies for boron. The requirement for sub-Kev implants is primarily driven by the need to reduce transient enhanced diffusion. Sputtering related dopant loss and other phenomena will most likely preclude the use of sub-Kev implant energies below 0.5 Kev, regardless of available beam current.

Reducing the implant energy, annealing time and dose are of primary importance for achieving the shallowest junctions. Ultra-fast ramp-up rates are of secondary importance—their potential benefit can only be captured with an equally fast ramp-down rate not achievable in today's rapid thermal processing systems. Several combinations of implant and annealing parameters (implant energy, dose, annealing temperature, time and ramp rates) are possible that yield the same junction solutions. It is essential to select solutions which optimize manufacturability.

The semiconductor industry continues to double device functionality every two years or so. It is thought this requires switching to new materials. Instead of aluminum, silicon dioxide and poly-silicon structures, some think that future integrated circuits are thought to be built from copper, low-dielectrics and high-k dielectrics, and "exotic" metals like hafnium and zirconium.

The traditional silicon dioxide insulator needs close thickness control and low defect density. These are thought possible with improved cleaning and oxidation techniques. As the required layer becomes thinner, leakage currents and reliability problems arise. Direct tunneling can occur in very thin layers, giving high leakage current. At 100° C., the maximum voltage rate of a 2.5 nm thick layer of silicon dioxide is only 1.5 v.

A silicon/dual-doped polysilicon gate stack process is used as the mainstay of CMOS device manufacturing since its inception. To replace this process, the new CMOS gate stack process, considered to be the most important film layer in integrated circuits, would require high-k dielectric gate insulator, with a dual metal gate electrode. The use of this new process should be no later than five years. This is generally thought impossible.

A flowable oxide based on hydrogen silsesquioxane is often loused to form ultrathin low-k insulating layers. Use of these layers reduces parasitic capacitance and thus shortens propagation delays. These changes increase by 30% the within-chip processing speed, as compared with other 180 nm CMOS processes.

The use of tungsten instead of aluminum allows fabrication of conductor widths down to 240 nm below the normal metal layers at gate level. The extra routing flexibility achieved by the local interconnect layer enables the silicon area to be reduced by some 10% to 20% in typical core cells. It also permits the spacing between tracks in the first metal layer to be considerably increased, reducing defects in this layer and increasing the yield despite the extra process step.

The traditional silicon dioxide gate insulator presented challenges, such as the need for close thickness control and low defect density. These are thought possible with improved cleaning technology and oxidation techniques. As the required layer becomes thinner, leakage currents and reliability presented problems. Direct tunneling can occur in very thin layers, resulting in high leakage current. At 100° C. the maximum voltage rating of a 2.5 nm thick layer of silicon dioxide is 1.5 V.

High-k dielectrics is one of the major road blocks in device scaling. With extremely smooth gate dielectric and very small channel length, the transistor drive current goes ballistic, increasing the input current flows via the channel from the usual 35% to 85%. The remaining input current collides with the rough edges of the insulating layer.

Low-k polymer dielectrics have been used to replace glass insulators to separate the new copper wires in the new chips. Copper lead wires are also replacing aluminum wires. This material combination will push chip speeds to about one-third faster than today's fastest chips. There are, however, problems to using this system: 1) the plastic is much softer than glass and does not stay in place, making it difficult to make the chips; and 2) these polymers also do not stick to other materials including silicon and other polymers.

Tungsten is replacing aluminum interconnects. The use of tungsten reduces the conductor widths down to 240 nm below the metal layers at gate level. The extra routing flexibility achieved by the local interconnect reduces 10–20% of the silicon area. The spacing between tracks in the first metal layer can be considerably increased to reduce sensitivity of this layer to defects thereby increasing the device yield. However, the very high tungsten density of 19.3 (vs 2.7 for Al, 2.33 for silicon and silicon dioxide) induces deboning from other materials during fast accelerations and decelerations, as shown later.

The capacitance between the gate and channel of an insulated gate FET needs to be high, but in small area devices this cannot be achieved by using a very thin silicon dioxide layer, or the leakage current will be too high, most likely due to material imperfections. A polysilicon gate electrode has been used with germanium doping to control the work function of the material. A variety of metals will be tried as gate electrodes, with TiN/Al or TiN/W being the most likely candidates. Also considered are deposition of high-k gate insulators by the atomic layer chemical vapor deposition technique using aluminum oxide, hafnium oxide, titanium oxide, zirconium oxide, and silicates such as those of zirconium and hafnium.

Ballistic effects occur around the 30 nm channel length when the electrons emitted from the source arrive at the drain without scattering. Small dimensions have great impact on the electrons. The channel lengths of conventional transistors are so long that electrons seldom go all the way from the source to the drain without scattering. But when the channel length gets down to around 35 nm, the ballistic component increases and device performance improves. However, once ballisting occurs, further reduction of the channel length no longer improves the performance. Electrons travel better when the gate oxide is slightly thicker because they are less attracted to the gate directly above the gate oxide layer.

There still is plenty life left in traditional gate structure. Take, for example, the "ballistic nanotransistor". In these devices, dramatic gains in drive current are possible simply by combining a very smooth gate dielectric with a short channel length, such as in Vertical MOSFET. The main challenge is to replace the traditional silicon dioxide/dual-doped poly-silicon gate stack process. This process has been the mainstay of CMOS device manufacturing since its inception. The new CMOS gate stack process will require the cost-effective, low-temperature integration of nanometer scale high-k dielectric gate insulators, with dual metal gate electrodes. The replacement should be within five years. History has shown, however, that changes of this magnitude normally require ten years or more to implement.

The very slow process in finding new semiconductor materials is looming as a grand challenge in chip design. There are still many, many problems that are material-limited particularly for new improved devices. New material selection, design, and processing methods must be found and made. The whole manufacturing process is generally too complicated involving, e.g., too many materials and equipment to achieve high repeatability and good device yield, performance, and repeatability. Most of the materials are not applied in optimal ways. This invention will address many of these issues.

BRIEF SUMMARY OF THE INVENTION

A method of mass-producing an atomic or molecular semiconductor device comprises supplying a solid state material substrate; providing two adjacent semiconductor pockets and forming a gate layer less than 10 Angstroms thick, having atomically smooth major surfaces; and perfectly chemically bonding, uniformly and defect-freely, this gate layer onto the substrate to improve and manage the device yield and performance To overcome the foregoing and other difficulties, the general object of this invention is to provide an improved, semiconductor or solid-state IC with improved performance, yield, cost, and miniaturization;

Another object of the invention is to provide vastly smaller but improved, atomic solid state devices, each with an interfacial electrically rectifying barrier region of the PN junction, metal-oxide, or metal-semiconductor type;

A broad object of the invention to provide an integrated semiconductor circuit with thin-film isolating material layers to form at least one of the critical parts thereof;

Another object of the invention is to provide a new, improved gate layer that can be easily and rapidly produced to near perfection at high yield and low cost;

Yet another object of the invention is to provide a new, improved field isolation layer that not only improves circuit performance but allows further miniaturization;

A further object of the invention to provide an integrated semiconductor circuit with an isolating material layer which is sufficiently thin and flexible, thereby not only advancing device miniaturization, but improving the performance of the circuit and minimizing thermal or volume expansion mismatch stresses on the circuit;

Another object of the invention is to provide a new generation of low-cost environment-resistant flexible circuits;

Another object of the invention is to mass-produce single-atom or single-molecule IC selectively operative in a single-hole, single-hole, single-carrier, or single-photon mode;

A still further object of the invention to mass-produce, on a single chip and with minimum number of processing steps and at low cost but high yield, thousands or millions of transistors more miniaturized than is presently possible; and A still another object of the invention is to provide highly miniaturized electro-optical three-dimensional, two-dimensional, or one-dimensional atomic or molecular diode or transistor arrays especially suitable for optical telecommunication.

BRIEF DESCRIPTION OF THE DRAWINGS

Various other objects, features, and advantages, and a more complete understanding of the invention, will become apparent to those skilled in the art from the following description and claims, taken in conjunction with the accompanying drawings.

For the purpose of illustrating the invention, there is shown in the drawings the forms which are particularly preferred. It is understood, however, that the invention is not necessarily limited to the precise arrangements and instrumentalities here shown but, instead, may combine the same described embodiments or their equivalents in various forms.

DETAILED DESCRIPTION OF THE INVENTION

Various other objects and advantages, and a more complete understanding of the invention, will become apparent to those skilled in the art from the following description and claims, taken in conjunction with the accompanying drawings.

Figure 1:
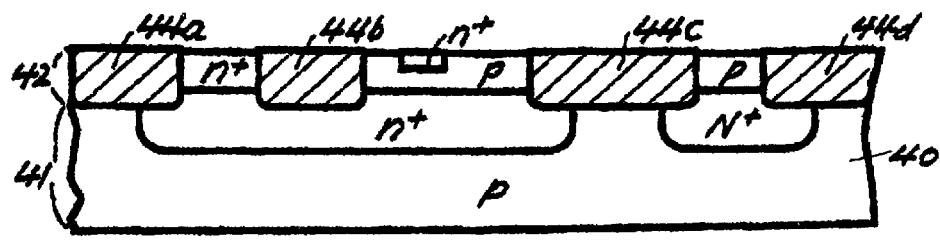
FIG. 1 is a partial vertical cross-section of a prior-art Fairchild's Isoplanar MOS device with a flat-bottomed and mostly vertically straight-sided isolating groove.

Several of the prior-art methods, described below, are useful or even necessary to make the extremely small high-precision semiconductor circuits of the present invention:

1) As shown in Li's U.S. Pat. Nos. 3,430,109 and 3,585,714, one can use a number of submicroscopically precise methods to remove materials on, or implant foreign atoms into, the device wafer:
   a) mechanical grinding or polishing with realtime feedback control (See: U.S. Pat. No. 3,430,109, FIG. 1 and col. 2, lines 38–64 (or U.S. Pat. No. 3,430,109: 2/38–64);
   b) precision chemical etching using repeated masked chemical etchings immediately after pre-cooling to prevent localized, nonuniform or preferential deep etching at dislocations and subgrain boundaries (U.S. Pat. No. 3,585,714:11/75-12/59);
   c) energetic particles bombarding with aligned or focused ion, electron, proton, laser photons (U.S. Pat. No. 3,585,714:11/24–42). Such energetic particle beams of Argon atoms, electrons, photons can locally heat up or energize the intercepting surface atoms to evaporation or ejection. Ions and proton beams of selected foreign atoms, such as O, N, Si, Ge, Ga, B, P, As, can also be very precisely implanted into semiconductor wafers;
   d) combination of the above methods; and
   e) the precision grooves so made are of many types: cylindrical, ellipsoidal, spherical, or conical as described by Sanders et al but invented by Li in the '109 patent, with a radius of curvature of 1 cm, 0.1 cm, 0.001 cm, 1 micron, 0.1 micron, down even to one or a few atoms or molecules in sizes in this invention.

Laser processing and ion implantation are particularly important. Laser beams can be controlled by simple stable optics, while electron and ion beams by electrostatic deflecting means. According to Li in his prior cited references, all the above methods may automatically provide sensors to realtime monitor the degree or progress of removing material from, or introducing material into, the device wafer. This realtime self-optimzing, closed-loop feedback control (See Li's U.S. Pat. Nos. 6,513,024 and 5,410,634).

Using these prior-art methods, this invention relates to methods of making solid state integrated circuit devices and more particularly to methods of making improved, miniaturized semiconductor integrated circuits devices to achieve very high resolution and nano or even atomic accuracy otherwise impossible. For example, precise depressions or grooves in silicon can be accurate to nanometers or angstroms in dimensions in sizes, lengths, widths, depths or thicknesses, accuracies, precisions, curvatures, shape, chemical composition profiling, and lateral locations from other components.

In the real-time self-optimized process control of IC manufacturing, the thickness of the semiconductor or insulating material layers or even the PN junction regions being formed or processed may be the sensing medium, without any extraneous outside equipment or component material. The sensed data may include optical transparency, electrical resistances, temperatures, thermal conductivities, leakage currents, and other electrooptical properties of the semiconductor or insulating layer materials.

The gate and field isolating layers of MOS transistors are usually made by thermal oxidation or nitridation. Thermal oxidation of silicon with $Si_3N_4$ masks was well known prior to 1968. See, e.g., V. Y. Doo in "Silicon Nitride, A New Diffusion Mask," IEEE Transactions on Electron Devices, Vol. 13, No. 7, 1966, pp 561–563. For masking in thermal nitridaiton, various metal layers such as Ni, Au, Pt may be used.

As an alternative to thermal oxidation or nitridation, oxygen and nitrogen may be introduced into the silicon host by ion or proton implantation. Under an implanting voltage of one megavolt, for example, oxygen and nitrogen ions can be introduced into silicon host to a depth of 1.7+/−0.13 um and 1.87+/−0.12 um, respectively. Because of its excellent spatial and dose control and ease of manufacture, ion implantation has become the most prevalent method of adding foreign atoms into semiconductors.

Shockley, Gale, Kellett et al, Sibley, and Wilson invented various important ion implantation techniques, disclosed respectively in U.S. Pat. Nos. 2,787,564; 2,434,894; 3,341,754; 3,326,176; and 3,563,809. These scientists showed the unique features of implanted ions including:

1) straight penetration without appreciable lateral diffusion to give orders of magnitude sharper boundaries than the usual thermal diffusion;
2) controlled size of the implantation region down to less than 1 micron, with an accuracy of 1,000 Angstroms (0.10 microns) down to 10 Angstroms;
3) the ions can be implanted without masking, wet chemistry, and photolithography;
4) the implanted region need not start at the surface of contact with foreign matter;
5) the shape and three-dimensional chemical composition of the ions can be controlled at least to fractional micron accuracy;
6) when used for PN junction or oxide/nitride groove formation, the chemical composition profiles and, in particular, critical PN junction grading, can be of any selected shape, rather than only the exponential or erfc grading obtained with thermal diffusion, respectively for limited or infinite surface diffusion source of diffusion;
7) computer programmed control to deflect implanted ions to "write" with a collimated ion beam of selected mass to produce a predetermined integrated circuit pattern on the workpiece ('176:2/20–62); and
8) methods of introducing precise amount of impurities, such as oxygen, are available to achieve, even in a single implanting step, exact three-dimensional control in shape, size, location, and chemical composition, to fractional micron or even atomic accuracy by modulating the energy, current, duration, and position of the ion beam, and the use of Li's comuputerized self-optimizing process control, apertured masks, moving wafers, and ion deflection or separation systems.

Silbey in his U.S. Pat. No. 3,326,176 already disclosed "writing" with ion beams of selected mass. Recent developments allow the exct positioning of single atoms on a substrate. In 1999, Cornell University researchers observed atomic bonds by combining scanning tunneling microscope with vibrational spectroscopy. This technique makes it possible to individually move atoms or molecules to create extremely small, atomic or molecular structures. The scanning tunneling microscope not only won for the researcher a Nobel prize but has become the standard worldwide "tweezers" to sculpt nanotechnologically, atom by atom or molecule by molecule. Letters of single atoms have, for example, been written on silicon substrates. Conferences on manipulating single atoms into precise positions and other related topics such as atomic-layer CVD and molecular atomic spectroscopy are common these days.

I hereby incorporate these ion implanting and atomic writing references into this application.

A very brief review of materials commonly used in electronic material is in order. The semiconducttor transistor structures that we know today have been built on four basic materials: silicon at the base, silicon dioxide as an insulator, silicon nitride for the side wall, and aluminum for interconnect.

These and other substituting electronic materials vary greatly in electrical resistivities. For example, the resistivities of metals such as Al, Cu, Au, and W are in the range of 1 to 10 microohm-cm, and those of insulators such as diamond, glass, and quartz are $10^{-1}$ ohm-cm. Semiconductors, such as Si and Ge, have resistivities that lie in between metals and insulators.

After doping by thermal diffusion or ion implantation, a semiconductor can have very low resistivities close to metals, to remain as a semiconductor, or to have very high resistivities close to insulators. In the last case, e.g., intrinsic semiconductor silicon or germanium, the valence and conduction bands of the perfect silicon is totally filled. There are therefore no electrons or holes that can be accelerated, and no current can flow. A perfect or intrinsic crystal of silicon acts, therefore, as an insulator useful for metal-oxide-semiconductor (MOS) or, broadly, conductor-insulator-semiconductor (CIS) devices.

That such a practically useful MOS or CIS device is possible can be seen as follows. Conventional MOS devices sold by the millions or billions have gate oxide layers which actually are not pure silicon dioxide layers at all. This is because the oxide is in-situ thermally oxidized from, or ion-implanted into, not a pure silicon substrate, but an impure silicon substrate containing parts-per-million (ppm) or more of impurities such as Al, Na, Fe, Mg, Ca, P, B, As, Sb, O, N, and the like. The so-called "silicon" used to produce the oxide is actually a complex silicon alloy of many chemical elements. The "silicon dioxide" formed on this impure silicon alloy is also actually an impure silicon dioxide compound containing various insulating, semiconducting, or even conducting oxides of different metals or metal alloys in various proportions. Nevertheless, such an impure silicon dioxide material form extremely useful gate or field oxide layer materials on all the billions of existing "silicon" integrated circuit devices.

As shown above, an ideally intrinsic silicon material is an insulator. Depending on its purity, a practical intrinsic silicon material can be sufficiently electrically insulating, in comparison to or when used in combination with the p-type "silicon" substrate and n-type "silicon" pockets, to form the gate or field oxide layers of a practically useful MOS or CIS device. As will be shown shortly, such an intrinsic silicon MOS or CIS device is, at least as to environmental resistance, distinctly better than the conventional MOS or CIS devices, even though they may be less pure and, thereby electrically more leaky.

Figure 3A:
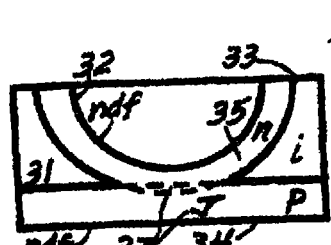
FIGS. 3(a) and 3(b) show partial vertical cross-sections of a prior-art intrinsic conductor-insulator-semiconductor (CIS) device first given in Li's application Ser. No. 154,300.
Figure 3B:
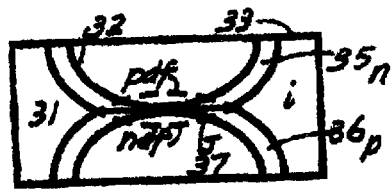

The use of an intrinsic silicon isolating field insulating groove to replace the common field oxide isolating groove was disclosed as early as Sep. 23, 1968 as FIG. 3 in Li's application Ser. No. 154,300. Such a groove was first claimed in Li's application Ser. Nos. 08/483,937 and 08/483,938, both filed on Jun. 7, 1995. I hereby incorporate by references these three prior Li applications into this application.

In this and all these and intervening applications, the intrinsic device of FIG. 3 is shown to have an isolating intrinsic silicon groove 32. This groove is formed into a cylindrically grooved top surface 33 of a slab or wafer of intrinsic semiconductor material 31 (FIG. 3a). Next, n-type and p-type dopants are diffused into the intrinsic silicon 31, respectively downward from the cylindrically grooved top surface 32 and upward p-type diffusion from the flat bottom surface 34 (in FIG. 3a) to produce the n-type diffusion region 35, and the p-type diffusion region 36. A PN junction region 37 is then formed which is surrounded on all its periphery by isolating intrinsic silicon 31. The same junction region can be planar or curved, depending on the surface concentration of the n-type and p-type dopants and also on the slab thickness. See, e.g., application Ser. Nos. 08/483,937 and 08/483,938.

In the device of 3a, the downward diffusion of the n-type dopant from the grooved, top cylindrical surface forms in the inert or intrinsic silicon material 31 a generally cylindrical n-type diffusional front (ndf) 35. This diffusional front is generally concentric with the cylindrical grooved surface 32, according to the laws of diffusion. The upward diffusion of the p-type dopant from the planar bottom major surface 34 of the intrinsic wafer 31 forms a generally horizontal and planar p-type diffusional front (pdf) 36. The PN junction region 37 must from where n-type and p-type dopant concentrations in the wafer is substantially equal, below the generally planar p-type diffusional front but above the generally cylindrical n-type diffusional front.

The PN junction region 37 is generally curved by virtue of the cylindrical n-type diffusional front being pushed up though also flattened by interaction with the planar p-type diffusional front. In this way, the PN junction region has a central horizontal portion that continuously extends sidewise and monotonically curves up from the central horizontal portion, to terminate at a right edge portion having a substantially positive slope in a first quadrant and at a left edge portion having a comparably substantial but negative slope in a second quadrant. Looking from the top, the PN junction is concavely curved.

The p-type diffused material 36 forms the substrate of the intrinsic semiconductor device. This diffused material has the same substantially planar bottom major surface similar to bottom surface 34 of the FIG. 3a device. In a first cross-sectional plane oriented normally of the bottom major surface, a left part and a right part of the PN junction region 37 are curved and nonplanar, and substantially symmetrical to each other with respect to another cross-sectional plane oriented normally of both the bottom major surface and the first cross-sectional plane.

The left part and a right part of the PN junction region 37 are also substantially symmetrical to each other with respect to the another vertical cross-sectional plane. Also, in the first vertical cross-sectional plane, a left part and a right part of each of the p-type diffused material 36, n-type diffused material 35, and undiffused still intrinsic material 31 have prespecified varying thicknesses, and are substantially symmetrical to each other with respect to the second vertical cross-section plane normally of both the major bottom surface 34 and the first vertical cross-sectional plane.

In addition, both the top and bottom major surface of the n-type diffused material 35, and the top major surface of the p-type diffused material 36, and the top and bottom major surface of the PN junction region 37, are all curved in substantially the respective entire portions thereof.

In a preferred embodiment for making the new gate layer of this invention, a laser system is used. The integrated device of FIG. 4 has a p-type silicon substrate 41, on which there are adjacent but laterally spaced-apart n-type silicon pockets 42. PN junction regions are formed where the n-type semiconductor pockets 42 contact the p-type substrate 41. The adjacent silicon pockets 42, respectively, a source and a drain regions, are laterally spaced apart by a gap of a prespecified gate length (e.g., 0.001–0.1 microns) on a top surface of the substrate in the gate area. For extreme dynamic resistance, both the substrate 41 and pockets 42 may be nearly intrinsic silicon material, respectively slightly p- and n-type doped. The gate area has a length roughly the same as, but slightly greater than, the prespecified gate length to minimize leakage.

In one preferred embodiment, the gate layer can be an oxide/nitride or even an intrinsic silicon material. This intrinsic material can be an equally n-type and p-type doped silicon leaving few uncompensated dopants producing an electrically inert silicon material for the device.

The gate layer 44 may be formed with such a material in such a structure as to be sufficiently yieldable or flexible to minimize effects thereon of thermal mismatch stresses between varying materials of the contacting substrate, pockets, and gate lead. This design significantly improves the performance and reliability of the semiconductor circuit device. With this improved gate layer, the useful life of the old silicon dioxide/nitride materials may be extended further into smaller devices.

A pulsed laser system is preferably used to form this gate insulating layer of an intrinsic silicon device. One may use, for example, a 1.5-KW carbon dioxide laser from Convergent Energy, a Q-switched 10-W system from Spectra Physics, or a 3.9 kW to 400-W-average pulsed Nd:YAG laser from Lumonics. The gate layer of the substantially electrically insulating, intrinsic silicon material is centered on the gate area but laterally extending slightly past edges of the pockets to prevent leakage.

The critical gate layer of the transistor should, of course, be as perfectly and tenaciously attached to the substrate as is possible and practical. But for the conventional straight or planar gate layer design, neither perfection nor tenacity is possible. When a very thin, flat, and imperfect gate layer 44 of material A (e.g., silicon dioxide) is attached to a flat substrate of material B (e.g., silicon), the thin, imperfect gate material A always fails when the transistor is thermally cycled due to repeated switched on-and-off. This is so regardless of any practical combinations of materials A and B, and generally regardless of how the two materials are formed. Material B is simply too thick compared to the much thinner, more fragile, and defective material A. The same inevitable thermal mismatch stress simultaneously applied onto both materials always fails material A, and not B. The thin material A will fracture into many small pieces whose sizes depend on the thickness of material A.

A thicker flat layer of the same material A, if inadequately chemically or metallurgically bonded and not simply physically attached to material B, still fails by peeling or flaking off as larger pieces. These universal failure modes have been repeatedly observed in the semiconductor and other industries.

Four solutions to this thermal and thickness mismatch problem are possible:

1) selecting materials A and B to be as close in chemical composition as possible minimizing differences in thermal coefficients of expansion in the first place;
2) making the entire IC including the gate layer laid on the semiconductor layer so thin that the circuit is flexible to minimize mismatch strains and stresses;
3) forming a curved gate layer material which minimizes thermal mismatch stresses through curvature-related stress-relieving effects explained elsewhere and also to be explained shortly; and
4) perfectly chemically or metallurgically bonding materials A and B.

This invention uses all these four methods. Solution (1) is self-evident. Solution (3) will be more fully explained shortly in the formation of the new field insulation layer in FIG. 5. For solution (4), please refer to U.S. Pat. No. 5,874,175. This patent discloses techniques to perfectly and strongly bond two materials with widely different coefficients of thermal expansion, even over large areas and with very thin bonding layers.

To understand solution (2), one should briefly review interaction forces between two neighboring atoms. According to the commonly used Leonard-Jones model, the forces between two neighboring atoms have two superimposed force components: a far-field attractive force which increases with the sixth power of the distance between atoms, and a near-field repulsive force which increases with the twelfth power of the distance between two atoms. When the two atoms are far apart, repulsion is negligible. When nearby, repulsion is predominant. When the two atoms are in equilibrium, the attractive and repulsive forces must be equal to a common equilibrium force.

According to this atomic model, an atomic chain or sheet a few angstroms in diameter or thickness for silicon can easily bend or flex enough to accommodate any thermal mismatch strain. The bending occurs when one or both atoms simply rotate around its neighbor without changing the distance therebetween. There is therefore no work done or energy consumed, since both the repulsive and attractive forces depend only the interatomic distance, which is constant before and after the bending. Nor are there any gain or loss of energy, due to either the attractive force or the repulsive force component. This has been observed even in "brittle" materials such as oxide ceramics, e.g., $SiO_2$.

Note that the attractive and repulsive forces decrease continuously, not abruptly. There should be no abrupt breaks or failures in the atomic chain or sheet, as we usually see on the conventional stress-strain testing curves. The abruptness results from force interactions among billions or more, not two or several atoms.

To bend a wire or sheet of only 0.1 mm thick, for example, an atom at the center of the wire or sheet may, if completely free, monoatomic in thickness or width, and not embedded in the semiconductor silicon layers 62 and 63, easily bends or flexes enough to accommodate any thermal mismatch strain. The bending or flexing is accomplished by rotating around its nearest neighbor with little strain, stress, or work done. But the atom at the periphery is spaced some 100,000 atoms away from the central atom or atoms. The strains at the peripheral atoms, multiplied by the Young's modulus, are much greater than any tensile, shear, or even compressive strength of the material. Also, about $10^{11}$ atoms must be simultaneously involved requiring extensive plastic deformation work and energy loss.

Figure 6:
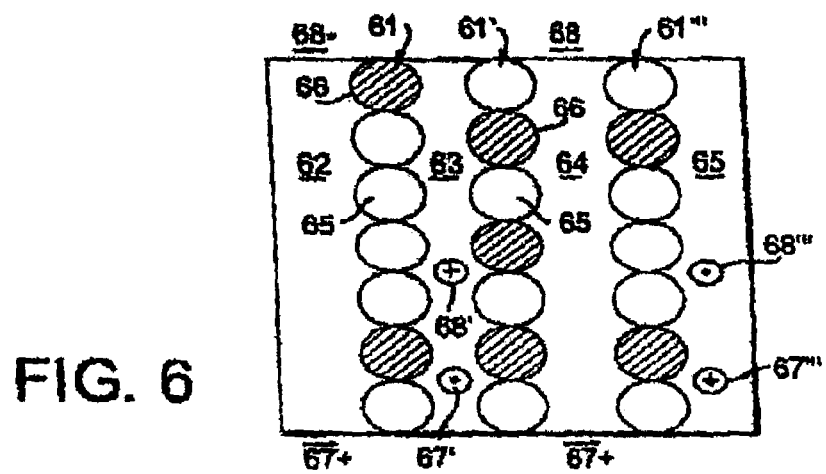
FIG. 6 is an atomic or molecular IC showing a mixed semiconductor-insulator solid-state device.

An embodiment of the FIG. 6 device comprises a chain or sheet of mixed doped silicon atoms 66 (hatched) and insulating materials such as intrinsic silicon atoms or oxide/nitride molecules 65 (in white), Dopants for the hatched semiconducting silicon atoms 66 include n-type dopant P and Sb, and p-type Al and B. These chains or sheets of semiconducting and insulating atoms (or molecules) 62, 63, 64 and 65 are embedded in p-type semiconducting layers 62 and 64, and n-type semiconducting layers 63 and 65.

What happens if one or more atoms in the chain or sheet, such as those special cross-hatched impurity-doped atoms 66, are of a material different from those of the semiconducting silicon or germanium atoms layers 62–65, or other layers of semiconducting molecules such as GaAs, InP, GeSi, or GaAlP? This depends, of course, on the properties of the special atom or molecule in the chain or sheet relative to those in the layers 62–65, especially in comparative electrically resistivity types and values.

Consider the simplest atomic silicon chain 61, if the special impurity atom or molecule 66 differs in resistivity values from the other atoms 69 in the chain or sheet by one or two orders of magnitude, or is metal-like or semiconductor-like, a new thin-film solid-state device or circuit then results, with film layer thicknesses ranging from several submicrons down to several or even one atomic thickness. Such device may be a single-electron, single-hole, single-carrier, or single-photon device, for reasons shown below.

In a preferred embodiment of the FIG. 6 device, the entire atomic chain or sheet 61, 61', or 61" is only one-half micron through several atomic layers to even one single atomic layer wide or thick. This chain is mostly of unhatched intrinsic silicon atoms or oxide/nitride molecules 69, but still has some hatched atoms of, e.g., P, Sb, Al, or B-doped silicon (66). The unhatched part, if perfect, forms a good insulating wall.

The semiconductor region 62 to the left of the chain or sheet 61 in the FIG. 6 device is here of the p-type semiconductor, while the semiconductor region 63 to the right of the same chain or sheet 61 is of a n-type semiconductor. A doped silicon atom 66 of either type on the same chain or sheet will then form an atomic or molecular diode.

For example, as shown in FIG. 6, any n-type doped semiconductor atom 66 with five electrons on each atom present on the chain 61 will join the n-type semiconductor material region 63 to become part thereof. The intrinsic silicon atoms or oxide molecules 69 for the isolating wall 61 electrically isolates the left p-side 62 from the right n-side 63, except where the impurity-doped semiconductor atom or molecule 66 is located forming thereat an atomic PN junction and a selected leakage or drift path.

The p-type region 62 has an external positive electrode 67 at the bottom of the semiconductor region 62 and an external negative electrode 68 at the top. The n-type region 63 has a negative electrode 67' at the front, and a positive electrode 68 at the rear. An external electrical field is thus produced in the region 63 causing the holes to drift toward the front of the region 63, and the electrons toward the rear in the same region.

When a light beam, such as from a laser beam, shines on the p-type material region 62 in FIG. 6, an electron-hole pair of carriers is locally generated in the region due to photon injection from, e.g., a laser diode beam. A laser diode can produce a ray of light at a precise wavelength and can modulate the amplitude of the light at very high frequencies without distortion by using a special optical fiber capable of lazing at the same wavelength. An optical array of laser diodes emits multiple laser beams useful in, e.g., an optical communication system. The device of FIG. 6 then can form, e.g., an optical reader.

Of the photon-generated hole and electron, the electron will be instantly recombined with a hole right where it is generated in the p-type semiconductor region 62. The hole lost by this recombination is replenished by the bottom positive electrode 67, supplying the hole needed to maintain charge neutrality in the region 62 and creating a first electrical signal.

The freed hole from the electron-hole pair in FIG. 6 will then: a) drift vertically upward through the field 67–68 to the nearest n-type impurity atom 66 and the associated PN junction field; b) be pushed rightward by the PN junction field into the n-type semiconductor region 63; c) instantly recombines with an electron in the electron-dominant n-type semiconductor region 63; and d) causes the back negative electrode 67' to supply an electron needed by the region 63 to maintain its charge neutrality, creating a second electrical signal.

The movement of the freed hole through the atomic PN junction at the impurity atom 66 and the supply for the lost electron by electrode 67' are done one at a time. Hence, the name single-carrier (hole or electron) semiconductor device. The hole-electron pair are generated by the impact of a single photon. Hence, the device of FIG. 6 is also a single-photon device.

The externally applied electrical fields from the external electrode pairs 67–68 and 67'–68', and the mobilities of holes and electrons in semiconductor silicon are known. The distances of carrier travels are related to the designed device structure of the insulating atoms 69 and the specified distribution of the dope semiconductor atoms 66 on the chain or sheet 61. Hence, the first electrical signal representing replenishing the lost hole in the p-type semiconductor region 62 and the second electrical signal representing replenishing the lost electron in the n-type region 63 have predictable time delays after the laser photon impacts on the device to generate the electron-hole pair.

These delay times can also be computer simulated or actually sample or model tested. The device of FIG. 6 thus is a useful optoelectrical device for monitoring, e.g., laser photon injections as to their exact locations, times, vertical and horizontal, front and back distances on the insulating chain or sheet 61, and horizontal front-to-back distances in the semiconductor region 63, frequency of photon injections, and carrier pair generations.

Decreasing the thickness of the p-type layer 62 and lower the light aiming point on region 62 in the device of FIG. 6 increases the sensitivity and reduces the delay time of the first electrical signal after the laser injection. Maximum sensitivity and minimum delay time of the first electrical signal in region 62 are obtained with minimum thickness of the p-type semiconductor layer 62, which is shown as continuous white vertical area in FIG. 6 but actually is filled with one to several or more columns of the insulating atoms or molecules 69.

Maximum sensitivity of the second electrical signal in the n-type region 63 is achieved with a minimum distance the photon-generated carriers must travel before getting through the PN junction gate at the impurity atom 66. Regulating the thickness of the region 62 thus also changes the sensitivity of the optical reading or light-sensing device. Monitoring the first electrical signal alone provides a one-dimensional (1-D) sensing device for the vertical direction.

Maximum sensitivity and minimum delay time for the second electrical signal requires the minimum thickness of the n-type layer 63 but a laser aiming point in region 62 closest to the negative electrode on the back of the region 63. The thickness of layer 62 can also be changed to regulate the sensitivity of the second electrical signal on the device if the photons strike only on the p-type layer 62. Monitoring the second electrical signal alone provides a one-dimensional light-sensing device for the horizontal direction from the front to the back surfaces of region 63. Hence, monitoring both the first and second electrical signals provides a two-dimensional light-sensing device for both the vertical (or top to bottom) and horizontal (front to back) directions.

Photons striking from the left of the device generate hole-electron pairs which travel the least distances in region 62 when collected by electrodes 67–68. The same carriers have to suffer transmission losses through silicon and oxide or doped atoms 66 before their collections. One transmission loss is suffered for collections by electrodes 67–68, two for collections by electrodes 67'–68', three time for collections by electrodes 67"–68", and so on.

Devices with more than four layers or regions 62-63-64-65 are also possible, giving three-dimensional sensing with the three electrode pairs 67–68, 67'–68', and 67"–68". The photon from laser or other light may also strike the device in all directions and not necessarily horizontally from the left only. Still, the one-dimensional (1-D), two-dimensional (2-D), and three-dimensional (3-D) light-monitoring or light-sensing devices are equally useful, because all the variables including dimensions, impact angles, distances are known or predetermined.

By changing the thickness of the layers 62 or 63, or both, to control the distance the photon-generated carriers must travel before getting through the gate at the doped silicon atom 66, the sensitivity of the this optical reading, light sensing device may be desirably regulated.

The impact of a single photon on the device of FIG. 6 generates at least two complementary electrical signals even in a single semiconductor chain or panel such as 61, 61', 61", or 61'''. These two signals confirm each other greatly enhancing the accuracy and reliability of the monitored results. This is especially important in telecommunication where no error is tolerable whether handling data, sound, or image.

If the light first strikes into the n-type region 63, similar reasoning applies with the following exceptions: 1) of the photon-generated electron-hole pair, the hole is instantly recombined in situ with the closest electron abundantly supplied in the n-type region 63. The freed hole cannot move leftward into region 62 because of the reversed PN junction at the impurity-doped atom 66, and must move therefore rightward into region 64; and 2) the external positive electrode 67' is at the front of the region 64, while the external negative electrode 68' is at the back of the region 63, so that the freed electrons drift toward the front while the freed holes drift toward the back in region 63.

The device of FIG. 6 has a next-to-the-bottom row of three impurity atoms 66. These three atoms 66 and the intervening semiconductor material regions 62, 63, 64, and 65, alone, can already form a one-dimensional light-monitoring device, for horizontal light monitoring, as shown, or for vertical light monitoring if the device is turned 90 degrees so that the three impurity-doped atoms 66 are aligned vertically rather than horizontally.

A diode can also be formed if the atoms are, instead of being n-type, p-type having only three electrons on each atom. Similar reasoning for the operational performance of the device used above also applies here.

If both regions 62 and 63 are of the same conductivity type, such as p-type, while the impurity-doped atom 66 is of the opposite type, e.g., an n-type dopant atom each with five electrons (or an extra electron compared to silicon) per atom, then a pnp transistor forms. One-dimensional, 2-D, and 3-D transistor IC can be similarly formed.

Figure 4:
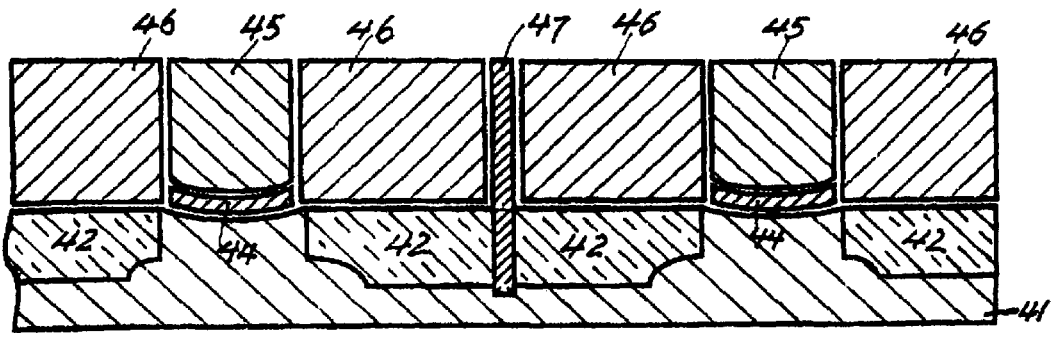
FIG. 4 is a vertical cross-section of a MOS or CIS device showing a new extremely thin, curved gate layer.

Even devices with multiple vertical layers can also be designed and electrically connected by vertical, long but narrow trenches, grooves, or holes with aspect or length/size ratio of over three or five, as shown in the vertical grooves 43 in FIG. 4 of Li's '300 application.

As an optical reader, the device of FIG. 6 has sensor components each having a size comparable to the side of two impurity-doped atoms 66, one for forming the PN junction and the other for insulation. Each sensor component then has a size of the order of 5 to 9 angstroms. The atomically thin, perfectly flexible optical reader panel or array therefore has up to 2,000×2,000=4,000,000 pixels per squar micron. A one-micron optical fiber having a square array area if 0.707×0.707=0.5 square microns in cross-sectional area may still contain up to 2 million atomic light detectors. These optoelectrical devices are especially suited for modern optical telecommunications.

Ultra thin, perfectly flexible 1-D, 2-D, and 3-D IC can thus be designed. Each active component in the IC operates selectively in as a single-electron device (SED), single-hole device (SHD), single-carrier device (SCD), or single-photon device (SPD) mode.

Many of these devices can also be designed according to FIG. 4, with extremely thin gate and field layer 47 for form CMOS devices useful for logic and memory application. Because of their extremely small sizes, simple manufacturing, low costs, but high performances, many undreamed-of electronic devices and systems can be devised.

For example, atomic-electromechanical (AEM) systems are now possible by simply replacing the micro or nano components with atomic components while keeping the mechanical components unchanged except for sizes. These new systems should find wide uses in various indsutries including: wireless, satellite, home appliances, buildings, structures, transportation vehicles, and defense and home security system.

These AEM systems are smart and can self-optimize, according Li's automation patents, e.g., U.S. Pat. Nos. 6,513,024 and 5,410,634. In this way, the wireless, satellite, applianes, buildings, structures, vehicles, and other systems all become smart.

One application of these new AEM systems is to implant them to replace damaged retina for the blind. Several national and international teams are working just on this important topic, with micromechanical (MEM) systems. But progress is slow and many serious problems because:

1) The silicon chips are flat, large, heavy, rigid, and inflexible;
2) The chips are difficult to be surgically implanted into the delicate eyes;
3) Hard, flat silicon chips make only point contacts with the retina on the spherical eye balls. These contact points are difficult to be determined and exactly matched onto the sensitive points on the chips;
4) Even if perfectly matched during surgery, the movement of the eye readily causes displacement resulting in loss of the desired alignment;
5) Perfectly matched and aligned MEM system to the retina easily lose the match and alignment when the eye ball moves;
6) The hard silicon chips refuse to bond well to the retina. Silicon, and even worse, the many device metals such as As, Sb, W, P, are not biocompatible with the eye, and easily detach from the retina;
7) The silicon still uses too much power which must be supplied outside of the eye. Heat dissipation around the sensitive eye is also a problem;
8) Even monocolor reception is uncertain. The image lacks contrast and is too fuzzy for the brain to recognize;
9) The equipment and surgery are too expensive for application to the large mass of blind people.

The new AEM could help solve many of these serious problems. AEM systems are thousand times smaller in length, width, and depth; million times smaller in area, and billion times smaller in volume. The presence of one or even many AEM systems in subnano sizes may not be felt, at least not badly. These atomic systems do not require special surgery to put into the eye, or to align with retina.

Because of their extremely small sizes, power consumption is so negligible that it could be supped by tiny voltaic batteries using two electrodes dipping in the saline eye liquid. The small power consumption minimizes the heat dissipation problem. The perfectly flexible IC layer intimately contacts the entire eye ball minimizing fuzziness of image and detachment from retina. Because of the minute quantities of solid materials, the new AEM IC is biocompatible, particularly if bio-inert diamond or single intrinsic materials are used for the its construction, as shown above. One third of the IC elements may be sensitive to one of three primary colors, or dyed to or covered with a filter for a different colors, in a close-packed triangular pattern, to achieve multi-color detection.

In addition, Li's real-time self-optimizing technologies disclosed in e.g., U.S. Pat. Nos. 6,513,024 and 5,410,634, could be used to help retina implant. The blind may give some sensing inputs or, a brain image systems may be used even when the patient is anesthetized. The placement, alignment with the retina, and IN-retina interface may be optimally done. During the surgery and subsequently, the patient's brain may be trained to optimally recognize the images with the minimum time or to provide ways to improve the implanting procedure or AEM design.

Replacing the doped silicon atom 66 by a semiconductor atom or molecule such as Ge (in Si), InP, GaAs, diamond, SiC, ferromagnetic, piezoelectric, or ceramic superconductor provides totally new generations of solid state devices of possibly far superior device performances and reliability.

The insulating chain or panel 61, 61', 61", . . . may not be atomic but have appreciable width in a direction normally of the paper in FIG. 6, and also in depths extending horizontally toward the back of the paper so that single impurity-doped atom 66 now are semiconductor regions of substantial sizes. On the other hand, each of the semiconductor regions 62, 63, 64, 65, . . . may be only single atomic layers of p-type or n-type semiconductor material. Ion-implanted or atomic tweezer-picked chains or arrays of insulating material atoms 69 and dope atoms 66 may form the required single atomic layers 61, 61', 61", . . . . As shown above, atomic layers of various materials have been formed. The semiconductor regions, reduced to single atomic layers, may even be reduced in widths to be single atoms wide. The solid optoelectric device then reaches an ultimate miniaturization. Still, the performance of the individual components will remain unaffected. The atomic tweezer-formed semiconductor lines or regions 62, 63, 64, and 65, together with the mixed insulator and doped semiconductor chains 61, 61', 61", . . . form light-sensing or light-detecting devices possibly only three or four atoms wide.

The optoelectrical components in the devices of this invention may vary in size from 0.1 microns down to atomic sizes of about 3–4 angstroms. The devices can find many uses in various industries. For medical applications, for example, the nano, atomic, or molecular sensors may be implanted, inhaled, or passed along tiny blood or their body fluid vessels in different parts of any small animals to study, e.g., real-time light-sensitive biomedical or biochemical actions or reactions to medicine.

Li's U.S. Pat. No. 4,690,714 also gives 3-D optoelectrical devices But the '714 patent and this invention are patentably different because: 1) The '714 devices generally have component sizes of 1 to 2 microns, certainly not several or even single atom sizes, or orders of magnitude larger; 2) The '714 devices do not have single-atom or single-molecule PN junctions, and are not single-carrier, single-hole, single-electron, or single-photon devices. In the '714 devices, the photon-generated carriers such as holes and electrons are simultaneously pushed through the PN junction not one at a time, but many through same the doped atom PN junctions 56. These signal carriers are not monitored one at a time, as in the device of this invention; 3) While it is possible in the '714 devices to be smaller than 1 or 2 microns by, e.g., splat cooling, the smaller components would loss size and shape uniformity and even crystallinity, and become useless; and 4) The location and size of the components are not accurate to fractional microns, and certainly not atomic sizes.

Figure 2:
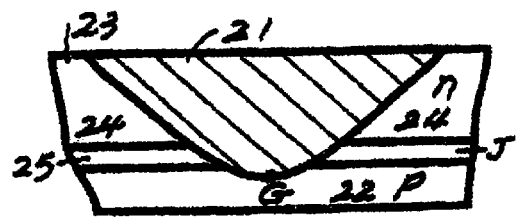
FIG. 2 shows partial vertical cross-section of Li's prior-art isoplanar device with a round-bottomed and sloping sided isolating groove of zero width.

As shown above, the gate layer is the most critical part of the MOS or CIS devices. Further, serious problems still exist. Some of the prior patented techniques are useful here to improve the new gate layer. Specifically, Li in U.S. Pat. Nos. 3,430,109 and 3,585,714 disclosed that a rounded or curved insulating oxide material groove (FIG. 2) lessens the splitting forces on the neighboring silicon material, because this insulating oxide material has a blunt, not a sharp, tip or bottom. There is no notch effect.

It is recognized that the more complicated the device materials and production equipment or process, the lower the yield and the higher the final cost. Also, to achieve submicron accuracy, thermal expansion and contraction must be controlled and compensated in all directions, during gate placement, oxide formation, and cooling.

As shown above, the gate layer 44 in FIG. 4 is the most critical part of the MOS or CIS device. Further, serious problems still exist. Some of the prior patented techniques are useful here to improve the new gate layer. A centrally rounded silicon pocket also achieve symmetry so that there is no weaker side.

With rounding, the mismatch stresses between silicon and other conductive contacting metals, and the adjacent oxide or other gate layer vary more gradually, not abruptly, graded near the rounded or curved bottom, due to curvature effects. These stresses are smaller on a curved adjoining surface than on a flat adjoining surface.

When material A is physically attached, or chemically joined or bonded, to a material B at a flat interface, severe interfacial mismatch stresses must exist due to different temperatures, dynamic conditions, or volume changes in in-situ compound formation. Physical attachments are not reliable at all. Failures are very likely or possible due to deboning of materials; poor or loss of electrical contact; fracturing of the thinner and weaker material into many pieces; and peeling of the thicker but weakly bonded material. With flat interfaces, no mechanisms exist to relieve or reduce the mismatch stresses.

The situation is different with a rounded interface. Rounding provides one or more mechanisms of stress relief. Being very close to the critical PN junction, a flat bottom of the oxide insulating groove often causes mechanical and subsequent electrical failures. With a rounded bottom interface having zero bottom width, the stresses are zero in the lateral direction at the bottom. Also, stresses are minimum and symmetrically distributed when the rounded bottom is symmetrical with respect to a longitudinal bisecting plane thereof. Symmetrical stress distribution insures that failure can occur on either side. That is, there is no weaker side so that the entire device is stronger overall.

The new gate layer of the invention can be formed by laser fusion. The layer then must have blunt and curved or rounded, with liquid-smooth surfaces due to atomic forces exhibited as surface tension. As shown below, fusion and solidification maximizes chemical purity, mechanical strength, crystallographic perfection, and even self-optimized, oriented grains for maximum strength and thermal or electrical conductance in a preselected preferred direction.

The laser remelted and resolidified gate or field layer can be an extremely thin layer with an atomically smooth bottom surface and no rough edges or sharp corners. It should be curved according to this invention. It may have a constant thickness across its lateral dimensions, except to terminate at zero thickness at its peripheral edges so that the thermal mismatch stresses between materials are also zero in directions normal to the thickness.

The new gate layer is not flat, but curved like a soft pancake in a bowl with a round bottom. The mismatch stresses are smaller on the curved pancake surface than if the pancake were flat. The horizontal mismatch stresses at the rounded bottom of the gate layer are symmetrical, minimal or zero.

Instead of being laser-formed, the gate layer 44 may be a thermally grown-in oxide or nitride, an ion-implantation-treated oxide or nitride, an ion-implanted intrinsic semiconductor gate layer of Si, Ge, GaAs, InP, SiGe, or other semiconductor materials with very few uncompensated dopants to thereby behave like an intrinsic semiconductor layer or at least substantially insulating layer relative to the p-type substrate and n-type pockets. These layers are not only electronically relatively inert and insulating to make useful CIS devices, but also are unetched, uncut, and otherwise similarly unmodified. This condition preserves the as-formed metallurgical continuity.

Metallurgical continuity or, even better, atomically perfect and continuous fusion-bonding of the new gate layer to a substrate 41 below and the gate metal lead 45 above, provides reliably perfect contacts and device structure, continuity, and repeatability.

As shown Li's U.S. Pat. No. 5,874,175, the silicon substrate, silicon pockets, and silicon oxide/nitride should be bonded with a nearly 100% dense, bonding region which is mechanically defect-free, with no visible microcracks at 1,000× magnification. The bonding interfaces should be liquid-diffusion graded to avoid high mismatch stress gradients thereat.

In contrast, CVD, PVD, and many other Solid-state layer forming processes involve only solid-diffusion, leading to at least five orders of magnitude steeper stress gradients. This is because liquid diffusion coefficients are universally about $10^{-4}$ cm$^2$/sec, while solid-state diffusion coefficients even at near the melting point are only about $10^{-14}$ cm$^2$/sec.

Filling or depositing particles of silicon, oxide/nitride, organic substances, or other materials into microscopic grooves or trenches may also be unreliable. Even with perfect nucleation and without shadowing effect, packing of perfect spheres according to the closest-packing hexagonal or face-centered cubic structures gives a maximum density of only about 75%. The packed layers are mechanically weak and chemically contaminating to the microscopically close to the PN junction, because the porous layers can "breathe" and are usually of non-pure materials.

The "Ceramic Composite" U.S. Pat. No. 5,874,175 discloses various ceramic bonding techniques to bond materials including oxidized metals and ceramics. In air, silicon is known to immediately form an oxidized surface layer of about 18 Angstroms in thickness. The disclosed techniques can produce reliable but very thin bond layers to metals or ceramics. Properly done, the bond strength can be more than the weaker of the two bonded materials A and B before bonding.

Generally, metals are the stronger material, and ceramics, oxides, silicides, or plastics the weaker materials. However, with selected bonding techniques, the weaker materials can be surface-strengthened to be even stronger than the unbonded material itself. These dissimilar material bonds are metallurgically perfect, without voids, microcracks, and other crack-initiating defects visible at 1,000× magnification.

These bonds can also selectively withstand 500, 630, 800, or 950° C., sufficient for the bonded assemblies to withstand any subsequent device processing procedures or service requirements, even for SiC or diamond semiconductor devices. These bonded material regions are different in structure, mode of operation, and results from the usual chemical or physical deposits, filled-in organics, flowed-on polymers, and spinned-on or painted-on oxides. In these later materials, there is inadequate, or even little, atom-to-atom bonds which make the deposits strong.

The above techniques for forming the gate layer can also be used for other parts of the CIS device. For example, extremely thin, curved field layers of CMOS devices can be similarly formed by, e.g., laser, to electrically isolate one semiconductor region to another. This will be disclosed in more detail later.

Besides mechanical strength problems, a non-perfectly bonded material layer with voids and microcracks gives problems of high leakage current, low breakdown voltage, and poor device performance, reproducibility, yield, reliability, and resistance to the ambient particularly as to moisture. Hence, the importance of perfect or defect-free bonding in microelectronics is evident.

As indicated above, a flat, very thin gate layer can not remain intact after bonding, particularly when subjected to significant stresses and strains. The flat surface provides no stress or strain-relief mechanisms, and the very thin layer has little strength to withstand even minimal thermal, dynamic, or volume change mismatch stresses. The very thin flat layer must fracture into many pieces destroying not only its mechanical integrity but its useful electrical utility. The curvature here is necessary to provide a number of stress-relief mechanisms. Such a curved gate layer is preferably provided in the same laser processing step, as shown below.

Proper bonding of the gate layer to the substrate 41 below and metal lead 45 above insures stable and reliable electrical contacts. A gate layer perfectly bonded to the substrate material alone is still not sufficient. The gate layer must also be prepared by proper metallization on its top surface for perfect and defect-free bonding thereto of the conductive gate electrode 45. The conductive gate electrode is formed of an electrically conducting material generally centered on the gate area to control flow of electronic carriers from the source semiconductor pocket to the drain pocket.

The top bonding of the gate layer is as equally important as the bottom bonding. The above-mentioned U.S. Pat. No. 5,874,175 bonding patent provides techniques for atomic engineering the oxide-silicon interface to achieve mechanical and electrical perfection and thermochemical stability, so that the bonding strength does not decrease with time during service, as often observed. High interfacial perfection not only enhances mechanical and thermochemical stability, but also device performance including enhanced and reproducible dielectric constants.

Useful interface atomic engineering techniques disclosed in the '175 patent include: replace failure-initiating oxide or silicon surface voids and microcracks with mechanical, thermal, and electrical strengtheners, material purification and dielectric enhancement, grain refinement and preferential orientation to facilitate thermal and electrical conduction, and functional composition grading to meet special service requirements as to, for example, oxygen. The laser processing can be designed to self-optimize to achieve these desirable qualities not available with other processing methods.

For example, unidirectional cooling produces columnar grain growth. The anisotropic grains in the bonded regions are highly beneficial to achieve bonds with preferred direction of mechanical strength and thermal or electrical conductivity. The bonded region also have refined and highly purified gate layer material, with unique, uniform and repeatable properties. The uniformity results because the columnar grain growth is from a liquid melt in which materials diffuse at a liquid diffusion rates of about $10^{-4}$ cm$^2$/sec or about 10 orders of magnitude larger than many of the common layer-forming processing with only solid-state diffusion rates. Chemical composition profiling across the bonding interface, grain sizes, and mechanical properties are also more gradual, uniform, and reproducible.

Under unidirectional cooling and freezing processes in a direction normally of the gate layer, the dielectric material is purified according to the principles of normal freezing and William Pfann's unidirectional temperature-gradient zone melting (Wiley, New York, about 1950). These processes generally achieve orders of magnitude in material purity based on the segregation coefficient on the relevant alloy phase diagram.

A silicon melt containing either Fe or Co, for example, has a segregation coefficient of only 0.000,008. The silicon layer is therefore purified by over 125,000 times by simply directionally freezing once, or by over 15,600,000,000 times by directionally freezing twice. Similar purification results if the silicon dioxide layer is also melt-purified to achieve vastly improved dielectric constant.

Proper melting and freezing is by far the fastest, simplest, and most reproducible and cost-effective method to produce high-yielding, high-quality semiconductor devices. It is not coincidental that years ago the best transistors and diodes are made only by melt growth processes.

Applied to the gate layer formation, the melt growth process of the present invention also is the simplest, fastest, and most cost-effective method of uniformly producing high-quality gate layers. Most specifically, the new gate layer material can be the purest, most defect-free, crystallographically perfect, uniform, with the thinnest but strongest grain or subgrain boundaries, and the exact desired dielectric constant otherwise impossible to obtain. The subgrains are substantially uniform in width or size and height.

Integrated circuits of the invention must have atomic accuracy in shapes, sizes, spacings, and material properties. The circuits must be controlled and compensated in all directions. During the hundreds of IC processing steps including the critical gate placement, oxide formation, and exact cooling. The more impure the device materials and the more complicated the processing equipment and procedures, the lower the device yield and the higher the final device cost.

The formation of the new gate layer, particularly with a fast-acting laser, gives at least a multiple of the following important advantages:

1) The laser heating melts the gate layer material and smooths the top and the more critical bottom surfaces by an atomic surface-smoothing mechanism, i.e., atomic surface tension forces applied on a free melt surface. This achieves minimum roughness on both the top and bottom dielectric surfaces. As shown above, a smooth gate dielectric surface with very small channel length leads to improved transistor performance. Since silicon and $SiO_2$ differ significantly in thermal conductivities and surface reflectivity, a laser heating process must be designed as to pulse speed, power, and duration to melt preferably only a surface layer of $SiO_2$ without significantly affecting the underneath silicon substrate;

2) Solidification of the molten oxide gate layer material, sub-layer by sub-layer, from the bottom surface up purifies the gate layer material not only greatly reducing impurities, inclusions, stresses, defects, but improving insulation partly by purification. Most of this purification takes place precisely at the critical bottom surface facing the substrate. Hence, the first solidified sub-layer, closest to the substrate, has the most purified dielectric material;

3) Any substrate silicon top layer melted by the laser is also highly purified. For example, Fe, Co, Zn, Au, Cu, In, Bi, Ga, Al, As, Sb, Li, and B respectively have distribution coefficients in freezing silicon of 0.000008, 0.000008, 0.00001, 0.000025, 0.0004, 0.0004, 0.0007, 0.0080, 0.002, 0.023, 0.3, 0.01, and 0.8, according to CRC Handbook of Applied Engineering Science, Ed. R. E. Bolz and G. L. Tuve, Cleveland Ohio 1970, pp 206–207. The purification factors for this list of elements are, respectively, 125,000, 125,000, 100,000, 40,000, 2,500, 2,500, 1,428, 1,250, 500, 43.5, 3.33, and 1.25. Except for p-type dopants As, Sb, and B, a single freezing purification is generally sufficient. If not, the process may be repeated by pulse heating the resolidified layer to purify a second time for achieving combined purification factors of up to 15,625,000,000 times. Even a third or more time of freezing purification may be applied, especially with intrinsic silicon containing low-segregating dopants As, Sb, and B. The laser-melted and resolidified $SiO_2$ or other material gate layers also contain various undesired impurities as shown above. These impurities in the gate layer will be similarly removed by melting and resolidification;

4) While molten by laser heating, the gate layer material may be removed by laser evaporation or sputtering, leaving an extremely thin layer (e.g., 0.1 micron down to 1–2 atomic layers) of melt-refined material. The highly pure $SiO_2$ has very high dielectrical constant should freeze into a concavely curved depression when looked from the top. This purified and refined gate layer has exceptional bottom smoothness and minimum microcracks, voids, inclusions, and stresses. As shown, the curvature minimizes mismatch strains and stresses due to thermal expansion, density differences, or volume expansion to form $SiO_2$ from Silicon;

5) Microsecond, nanosecond, picosecond, or even femtosecond pulsed laser heating instantly heats up a superficial top layer which splat cools. The bottom surface of the molten layer has an extremely short solidification cycle. Such fast solidification gives very little time for grain growth. Extremely fine grains with minimal grain boundaries therefore result. The fine grains again produce the desirable, smooth gate dielectric facing the substrate. Further, the purified and defect-free grains crystallites must be oriented in the cooling direction normally of the local bottom gate layer surface. This orientation maximizes thermal and electrical conductivities in the most desirable direction. Note that the laser pulse heating is so fast that it can be designed to heat and melt refractory oxide (e.g., $SiO_2$ melting above 1,300° C.) without too much affecting the substrate silicon;

6) The laser and other auxiliary heating systems can be automatically feed-back controlled according to Li's self-optimizing patents cited herein, so that the molten material optimally melts and freezes into solidified elongated grains or even single crystallites. These grains or crystallites have extremely purified Si or $SiO_2$ dielectrical materials. The $SiO_2$ crystallites consist of extremely purified dielectrical material and have very thin, mechanically perfect grain or subgrain forming excellent gate layer materials. These crystallites have the lowest thermal and electrical resistivities because they are highly purified and the intervening subgrain boundaries are the thinnest;

7) By flexing, the thin curved gate layer eliminates thermal and dynamic mismatch stresses and strains providing a perfect gate layer without microcracks. Microcracks cause unwanted instabilities, leakage currents, and boron penetrations; and 8) The laser heating produces a molten gate material which promotes an intimate, metallurgical liquid-diffusion graded bond. This bond atomically matches in dimensions, continuously across the entire contact interface region, without thermally and electrically insulating voids or microcracks visible at a magnification of over 1000× times. Such good bonds insure that the gate layer intimately tenaciously stays in place onto the substrate to insure reliably good electrical contacts.

As shown above, melt growth greatly purifies and strengthens the frozen materials, forms crystalites of uniform shapes, sizes, lengths, and spacings, and even with very good crystallinity and microstructure. In fact, each of the melt-grown grains or subgrains may be a perfect single crystallite with controllable orientation for specific electrical, thermal, optical, or other purposes. This bonding of the gate layer to the substrate generates a liquid-diffusion graded bonding interfacial region therebetween to reduce the thermal stress gradient across the interfacial region and to minimize stress-induced carrier mobilities changes.

A better bonding technique is possible by using a solution metallizing and bonding method given in, e.g., U.S. Pat. No. 5,874,175, without appreciably increasing the gate layer thickness. The solution metallizing method has already been successful in joining practically all ceramics including silicon dioxide, silicon nitride, silicon carbide, zirconium, and diamond. A perfectly bonded gate layer enhances the circuit yield, performance, stability, reliability, and life.

Gate layers on present MOS devices are already quite useful, except as to reliability and reproducibility in very fine devices with extremely thin gate layers. Hence, not all the beneficial qualities produced by the new laser processing method, i.e., atomically surface-smoothed, surface-strengthened, purified material, extremely thin gate layer; grain-refinement, grain orientation, and perfect bonding need all be present in any specific IC processing. In any case, one should use as few processing steps as possible if fairly good competitive yield is already obtained with as few of the new features of the invention.

Other improved material processing methods may also be used instead of laser. For example, focused electronic beam may be also used for the heating. Laser, electron, ion, proton, and other energetic argon particle bombardment may be used to remove material for forming the depression with curved surfaces or walls. Chemical-mechanical polishing (CMP) methods are also useful to form some of the curved depressions or to produce the curved, extremely thin gate layers.

Ion implantation can produce ultra-fine regions of insulating, conducting, and semiconducting materials, even completely inside the semiconductor. In particular, multiple ion-implantation steps may be employed to introduce p-type or n-type dopants, oxygen, nitrogen, and other foreign atoms precisely into the silicon substrate, in precise quantities and chemical profiling, shapes, sizes, and spacings. The required implanting voltage may vary from 1 megavolt, 100 kilovolts, 10 kilovolts, down to less than 1 kilovolt. Even under an implanting voltage of one megavolt/oxygen and nitrogen can be introduced into silicon host to a depth of 1.7+/−0.13 and 1.87+/−0.12 microns, respectively. That is, the accuracy of the implanting depth is already about 0.12 to 0.13 microns some 30 years ago. Smaller implanting voltages used nowadays gives even greater implanting accuracies.

Properly focused laser beam can be 20–40% smaller than gate gap width but still with enough power to remove the molten gate layer material to produce a concave (looking from the top) groove or depression covered with precisely the required amount of thin gate layer material of, e.g., 3–40 Angstroms. It has been found that neutralizing photons in the laser beam facilitates the focusing to a smaller size. Similarly, ion beams may be neutralized by electrons to achieve similar results.

Precision silicon removal by laser also achieves two unique effects: a) thin layers of even brittle ceramic materials, such as $SiO_2$, become flexible and can tolerate much greater thermal mismatch stresses and strains without microcracking or void formation, thereby maintaining the exacting desired properties of the gate layer material; and b) a concave or any concavely curved groove surface can resist thermal mismatch stresses by neutralizing the mismatch strains, through a curvature-related stress-relieving effect, as shown above and later.

A rounded insulating gate material groove lessens the splitting forces on the underneath silicon substrate layer because the $SiO_2$ groove bottom has a blunt, rather than a sharp crack-initiating tip or bottom. There is therefore no notch effect. The mismatch stresses between silicon and the insulating gate layer vary gradually, not abruptly, near the rounded bottom, due to curvature effects These stresses are smaller on a curved adjoining surface than on a flat adjoining surface. In particular, the stresses are zero in the lateral direction at the bottom if the bottom has a zero width, and minimum and symmetrically distributed when the rounded bottom is symmetrical with respect to a longitudinal bisecting plane thereof. The zero bottom width and symmetrical depression shape are made by proper laser focusing procedures.

The laser melting of the gate layer provides an atomic surface-smoothing process to achieve a liquid-smooth surface on the lower surface of the gate layer facing the substrate. When molten, the gate layer material has atomic surface tension forces on the melt surface to produce the liquid-flat, lower gate layer surface.

The laser beam can be focused to such a beam size with such a power density profile to remove a selected part of the melt materials by material ejection or evaporation thereby forming a concave depression containing the remaining melt material. Rapid or splat cooling of the remaining molten gate material produces ultra-fine solidifying grains or subgrains further smoothing the lower gate layer surface. In addition, progressively solidifying the melt material from the bottom up purifies the solidifying melt material, according to the relevant phase diagram of the gate layer material. The most material purification occurs precisely at the lowest or first-to-freeze layer closest to the substrate to thereby having the best gate material properties including the highest electrical insulation properties thereat.

Generally, a single melting/solidification/purification is adequate. When needed, remelting the solidified gate material 30 and repurifying the remelted gate material may be used to achieve further material purification for additional improvement in the electrical insulation and other properties of the gate layer. The laser melting and resolidification process also gives a gate layer material which is thoroughly aged by liquid diffusion. This gate material is fully compatible with silicon at the interface, mechanically and thermo-chemically, and can tolerate further silicon processing and temperature cycling.

The focused laser beam additionally gives a curved depression designed to reduce substantially the thermal mismatch stresses through a curvature-related stress-relief mechanism. Generally, the gate layer should have a concave shape when looked from the top, with a radius of curvature of less than 0.5 to 1.0 microns, or less than fifty times thickness of the gate layer.

An alternate method for forming a thin, flexible, liquid-smooth, and curved gate layer is as follows. First smooth the top surfaces of both the source and drain regions by additional precision chemical etch of CMP with automatic real-time feed-back control. Dopants are very superficially implanted into these regions in very high concentrations. A very superficial top layer of each smoothed surface may be further smoothed by fast laser or microwave heating to above 1,000° C. for less than several seconds, or even to the point of superficial liquidisation and liquid smoothing.

Such very rapid superficial heating, applied for a very brief time particularly during heating up and cooling down, achieves additional benefits in producing the highly desired, very shallow but high activated (or dopant-concentrated and low-resistivity) junction rather than a longer anneal at a lower temperature. At such high spike heating rates, the common phase diagrams, which assume that all contacting components are always at complete thermal equilibrium, no longer apply or even relevant. New dynamic phase diagrams must be used. Dopant concentration much greater than the thermodynamic-equilibrium values are thus obtainable—a distinct plus for advanced devices.

The extra thin, flexible, and curved gate layer is then formed on the very smooth top surfaces of the source and drain regions. Heating may be required for better bonding adhesion. Again, very superficial heating by fast laser pulses, microwave, or both, are used to heat or even melt the very bottom surface of the gate layer. Athermal shock bonding or pressurized welding of the liquid-smooth, curved gate layer onto the top surfaces is desirable, with or without the addition of microwave or laser pulse heating.

The gate layer should be so thin as to be flexible and to relieve thermal mismatch stresses through flexing thereof. It should be no more than about 0.1 micron thick. One to three atomic layers may be the minimum. The gate layer should be of a size to make the gate width very small, such as less than 0.30, 0.20, or 0.10, 0.01, down to 0.001 microns, to thereby reduce the thermal mismatch stresses. These mismatch stresses are proportional to the gate width.

In a preferred embodiment, the gate layer has substantially the same material as materials of both the pockets and the substrate, and consists essentially of silicon, with up to less than about 10 ppm of impurities. Practically all the impurities are compensated, leaving few free electrons or holes to conduct electricity. The gate layer is thus practically electrically insulating. Because of practically the same composition, the gate layer, the substrate, the pockets, and even the doped silicon gate lead all have substantially the same coefficient of thermal expansion minimizing thermal mismatch stresses.

All the essential device materials in these new devices also have practically the same density, minimizing dynamic stresses due to vibrations, impacts, and high accelerations and decelerations. This can be seen as follows: Silicon has a density of 2.33 g/cc. Dopants such as P, B, As, Sb, Al, ... are unimportant because of their insignificant ppm or ppb ranges.

Silicon dioxide and silicon nitride have densities of 2.33 and 3.17, not much different from that of silicon. But not Al, Cu, Ge, Au, Ag, Ta, Ti, Hf, W and Zr materials used for contacts and interconnects. These contact materials have densities of 2.70, 8.96, 5.32, 19.3, 10.5, 16.7, 4.54, 13.3, 18.3, and 6.51 g/cc, respectively. When the semiconductor circuit is accelerating at 1 gravity level (G), there is a differential inertia force of 2.70–2.33=0.37, 6.63, 2.99, 17.0, 8.17, 14.37, 2.17, 11.0, 17.0, and 4.14 G acting on the Si-metal assembly to break it up by tension or shear. The G-levels to cause tensile failures in the silicon or silicon-metal interface can therefore be predicted by using the relevant tensile or shear strength of silicon relative to that of the particular metal.

As an example, at 10 G, both W and Au with the same density of 19.3 are exerting on the Si—W or Si—Au interface to tear it apart with a force of 17.0×10×980=167,000 and 107,800 dynes, respectively. The bond between silicon and other contacting metals in the silicon circuit is often merely physical and very weak. Yet, this bond, which critically governs the performance and reliability of the integrated circuits, can easily break up on conventional circuits under the acceleration or deceleration forces.

The new gate and field layers of this invention, particularly when metallized and bonded according to U.S. Pat. No. 5,874,175, uniformly or 100% dense with no voids or microcracks, ensuring their permanent, intimate bonding reliably to the substrate. These new gate layers are therefore resistant to environmental conditions particularly G forces occurring during shock, impact, vibration, and rapid acceleration or deceleration.

Si (density 2.33) integrated circuits containing only intrinsic Si as insulators, semiconductors, or conductors are the most resistant circuits to dynamic forces. This is because the two components materials, Si and intrinsic Si, have practically the same density differing by only ppm due to the ppm impurities. Si circuits containing silicon dioxide (2.334) insulators have density differences of only 0.004 g/cc or 0.172%; while Si circuits containing Al (2.70) conductors have a density difference of less than 16%. Silicon circuits containing the nitride (3.17), Ti (4.54), Ge (5.32), Zr (6.51), gold (19.3) and tungsten (19.3) have a density difference between its component materials of less than 36.1%, 94.8%, 129%, 180%, 728%, and 728%, respectively.

Using a single silicon material for the p-type and n-type pockets, isolating region, gate layer and gate lead materials achieves the best dynamic mismatch stresses and strains. The resultant circuits are extremely resistant to environmental impacts, vibrations, and large or rapid accelerations and decelerations. Even using materials with densities of no more than 10, i.e., Al, Cu, Ge, Ti, Hf, and Zr, will significantly improve the device's resistance to dynamic mismatch strains and stresses. On the other hand, materials such as W or Au should be eliminated for uses as device materials, if high-G forces are likely.

Any dopant changes in the pockets and substrate material due to the laser processing may be corrected by ion implantation of the proper dopants such as P, Sb, As for n-type and Al and B for p-type silicon. The implanting voltage should be no more than a value selected form the group consisting of 100 kilovolts, 10 kilovolts, and 1 kilovolt. Also, instead of intrinsic silicon, doped but nearly fully compensated silicon may also be used for replacement of the gate material.

In a fully compensated silicon, the n-type dopants and p-type dopants differ in dopant concentrations by no more than several ppb or less. Both the electron and valence bands are nearly completely filled, allowing very few carriers to move therein, thereby also providing a substantially electrically insulating material, particularly when in comparison to the conventional p-type substrate and n-type doped pockets.

In a similar way, a new field layer electrically isolating two regions of the same or different conductivity type in an integrated circuit can also be beneficially made of a thin, flexible electrically isolating material. Here, the semiconductor integrated circuit comprises: a semiconductor substrate of a first conductivity type, and a semiconductor pocket of the opposite conductivity type on top of the substrate thereby forming a PN junction region at where the semiconductor pocket contacts the substrate. A field layer of a substantially electrically insulating material is formed of a substantially constant thickness except at its bottom. At this bottom, the field layer is rounded and has zero bottom thickness or width (i.e., one atom thick or wide as shown by the field layer 47 in FIG. 4), according to the principle disclosed in U.S. Pat. No. 3,585,714.

FIG. 4 also shows the new curved, possibly atomically thin, gate layer 44 below the conductive gate lead 45. The new field layer starts at a top surface of the surrounding semiconductor material pockets 46, and extends substantially vertically downward pass the entire pocket depth, i.e., through the n-type region 42 into the substrate 41, i.e., sufficiently deep to thereby divide the pocket into two separate electrically isolated regions. Together with the PN junctions, this field layer physically separates and electrically insulates the two separated regions 42 of the pocket from each other.

The field layer also has such a material in such a structure as to be sufficiently yieldable to minimize thermal mismatch stresses between various contacting materials of the substrate 41 and separated regions of the pockets 46. In this way, the performance and reliability of the semiconductor circuit device is significantly improved.

Since the field layer 47 may be only one to several intrinsic silicon atoms or $SiO_2$ molecules thick, it occupies practically zero chip real estate. At least, it is hundreds or thousands times thinner than the conventional oxide isolating regions, such as the regions 41a through 41d in FIG. 1.

Li's prior solid-state device patents show the use of oxide isolating grooves which have zero bottom widths avoiding the flat portions on prior-art devices and enhancing device miniaturization. Except for a layer thickness of one to several atomic or molecular layers, the new field isolating layer 47 or 51 of this invention practically eliminate the entire space for the common field isolating groove or layer. This new design of the field layer thus saves much chip real estate thereby helping to achieve the most in device miniaturization.

Figure 5:
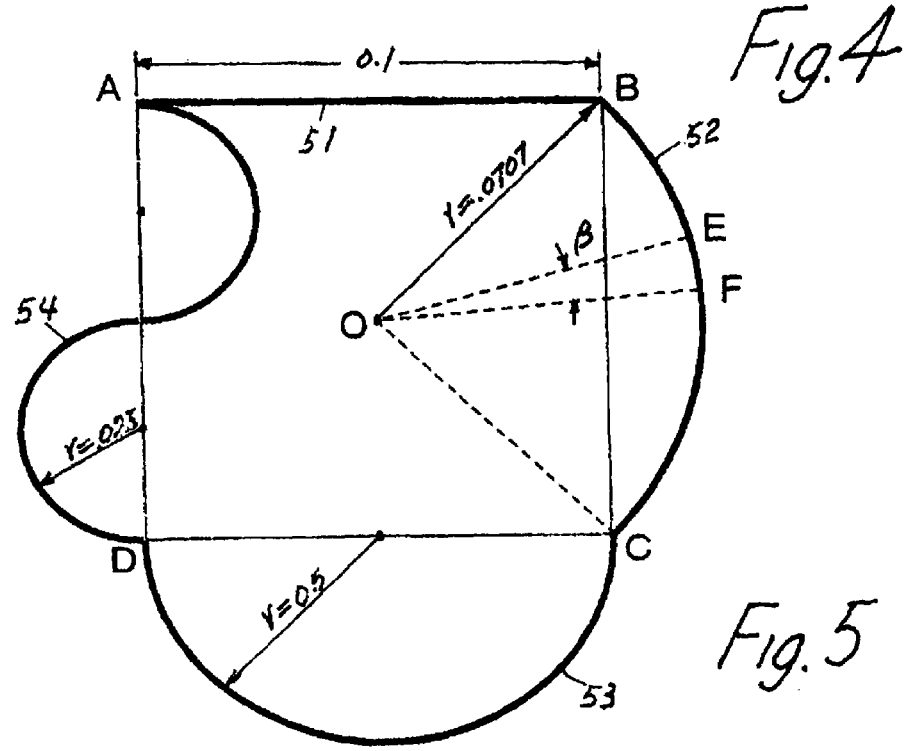
FIG. 5 shows a MOS or CIS device showing a narrow, thin-film curved or wavy field insulating layers or walls separating the device components.

The new field layer 47 of FIG. 4 has a curved shape on a horizontal cross-section, as shown in FIG. 5, to reduce substantially the thermal mismatch stresses. Reduced stresses maintain material integrity of the thin and fragile field layer. Except for its bottom, the entire field layer has a thickness of 20 down to one or two atomic layers.

The silicon pocket regions 46 have thicknesses of from 10 to 1,200 Angstroms. The thermal mismatch strain and stress, being proportional to a length, is therefore several to many times greater and more critical in the horizontal direction than in the vertical direction for the thin-film devices of this invention. On a horizontal cross-sectional plane, the new field layer preferably has a single circular curve or a multiple sinusoidal curves to best combat thermal mismatch stresses and strains, as shown in FIG. 5.

The new field layer 51 in FIG. 5 has a curved shape with a radius of curvature of less than 10 angstroms to 1.0 microns. Being thin, the field layer can flex and yield to relieve applied stresses thereby maintaining its material integrity and electrical utility.

It is desirable to have a thin and flexible, curved or rounded field layer 51. Because of the extremely thin walls, curvatures in the vertical cross-sections are difficult to form. Curvatures on a horizontal cross-section are therefore used instead. FIG. 5 is a top view of a square CIS of unit size, such as 0.1 micron square. This device has a perimeter of multiple insulating material wall of oxide or nitride material 51 ion-implanted into, e.g., a silicon substrate.

FIG. 5 shows a generally square-shaped CIS silicon device. Each device has four oxide isolating grooves or walls 51–54 to enclose the CIS device. Each of the grooves has a wall thickness of from 20 down to one or two intrinsic silicon atomic layers or $SiO_2$ molecules occupying negligible chip real estate.

Practically all the chip real estate is used for the actual circuit components. The top isolating groove or insulating wall AB 51 is a straight wall of unit length (e.g., 0.1 micron). The right circular isolating groove BC 52 consists of one-quarter of a circle of radius of 0.0707 microns (i.e., 0.1/square root of 2), with an 90-degree arc giving a curved wall length of 0.178 microns. The bottom half circular isolating groove or insulating wall CD 53 consists of one-half of a circular wall of radius of 0.500 microns, with a 180-degree arc length of 0.157 microns. The left isolating groove or insulating wall DA 54 is a 360-degree full wave with a radius of curvature of 0.25 microns, with an arc length of 0.157 microns.

FIG. 5 shows new mechanisms to relieve the unavoidable thermal mismatch strain between the silicon substrate and the generally square-shaped device thereon. This strain relief is due to the curvature of the insulating walls or field layers 51–54. The small arc length for each side is $l = r \times A$ where r is the radius of curvature and A the subtended arc angle. When thermal mismatch strain occurs, the small arc length for each side changes in arc length l by delta l to neutralize the strain as follows: delta l=delta (A×r)=r×delta A+A×delta r. That is, at least one of the radius r, arc angle A, and arc length can automatically change.

A new mechanisms of stress and strain relief therefore results through automatic changes in radius of curvature r, subtended arc angle A, and arc length l. Further, all these changes of delta l, delta A, and delta r must be in directions to reduce, but never to intensify, the strain. This is because all these changes merely respond to the mismatch strain, being not the cause or initiator of the thermal strains. In addition, the changes in l, r, and A automatically stops when the residual mismatch strain is so reduced by the changing l, r, and A that it can be tolerated in the thin insulating oxide wall of the device.

FIG. 5 further shows that for the same unit edge length on each of the four sides of the generally square circuit component, the top straight side, 51 or AB, is the least capable of withstanding mismatch strains because it is planar and not curved and has no r and A to change. Next comes the right side, 52 or BC, which has the least arc length with minimal capabilities of changing l, r, or A. The left side, 54 or DA, has the longest arc length. Even for the same linear side length DA, arc angle beta, the multiple arcs on the left side provide more opportunities to change the six variables on l, r, and A and, finally, the mismatch strain, on side curved 54 than on the curved sides 53 and 52.

The thermal expansion coefficient of silicon substrate is $a_1=0.0000027$ per °C., while that of the silicon dioxide insulating wall is $a_2=0.0000005$ per °C. The difference is 0.0000022 per °C. Hence, raising or lowering the silicon CIS by a mere 1° C. produces a thermal strain of 0.0000022 per unit length of the component. Assuming only the Young's Modulus of silicon is operative at 16,000,000 psi because of extreme thinness of the silicon dioxide insulating layer, a 1, 100, and 300° C. change in temperature in a device processing step or service condition then generates a thermal mismatch stress of 35.2, 3,520, and 10,600 pounds. A tensile strength of 7,000 psi for silicon dioxide is taken in the above calculations, according to Handbook of Applied Engineering Science, Eds. R. Bolf and G. L. Tieve, Chemical Rubber Co., Cleveland, Ohio, 1970, p 138.

Hence, a circuit processing step involving a temperature change of mere 199° C. can fail the thin, straight oxide layer on the top device edge or boundary AB or 51 of the FIG. 5 device. Yet practically all conventional devices have straight edges such as 51.

On the other three edges BC, CD, and DA, the conditions are more favorable. There are curvature-related strain and stress-relief taking place as described above and elsewhere and in Li's patents, e.g., U.S. Pat. No. 4,946,800. A particularly useful curvature effect can be seen as follows when applied onto the wall BC or side 52. This insulating circular wall has a radius of curvature of 0.0707 microns, and extends over an arc angle of 90°. Any small arc on this wall, e.g., EF, thermally expands less than the underneath silicon substrate.

For every ° C. increase in temperature, a thermal mismatch strain of 0.0000022 occurs, as shown above. If the wall BC or 52 were straight, as in wall AB or 51, a thermal mismatch stress arises tending to fracture the thin oxide wall. With a curved field oxide insulating wall BC of this invention, the thermal mismatch strain and stress are relieved through curvature-related relief mechanisms partly explained above and partly in U.S. Pat. No. 4,946,800.

During in-situ formation of silicon dioxide from silicon via thermal oxidation or ion implantation, the silicon host material undergoes a volume expansion corresponding to a linear expansion of 29.2%. See U.S. Pat. No. 4,946,800, col. 5, lines 57–67. Similar in-situ formation of silicon nitride gives a linear expansion of only 4.3%, or 6.79 times smaller than that during oxide formation. Hence, in-situ formation from silicon of silicon nitride produces only 14.7% of the mismatch volume strain and stress of those during similar in-situ formation of silicon dioxide, if silicon oxide and nitride have comparable coefficients of thermal expansion.

This huge difference at least partly explains the beneficial use of the nitride in place of at least some of the oxide in the formation of the gate layer or field insulating layer. The nitride, or mixed nitride and oxide is, thus preferred over oxide in forming the new gate or field insulating layers in the present invention. For similar reasons, the nitride or mixed nitride and oxide should also have better thermal resistances than the pure oxide.

As indicated above, the present oxide gate layers are very useful. They fail only when extremely thin oxide films are used, mainly due to fractures and leakage or tunneling currents. They also often don't stay in place or stick to the substrate. The use of extremely and uniformly thin bowl-shaped gate layer with a curved boundary in combination with a symmetrical zero-bottomed width should significantly overcome the high-stress and microcracking problems. A uniformly defect-free gate layer then forms to prevent or minimize boron penetration, leakage current, and tunneling electrons from the gate to the substrate through the gate oxide.

Merely making the new ultra-thin but perfect, curved gate (and field) layers with minimum channel length or gap size (below 20 or 10 nm) may be already sufficient to improve device performance and reliability, even without the other possible features of this invention such as atomically liquid-smoothed gate bottom layer of purified, oriented, strengthened or even single-crystalline gate layer material grains as described above.

Making semiconductor integrated circuits is not to achieve scientific perfection, but to rapidly and cost-effectively produce competitively good and useful circuits with simple and the minimum processing steps using the least number of processing equipment, processing steps, and device materials. As a matter of fact, simple minimum processing steps and the least number of processing equipment and device materials invariably lead to higher yield and lower cost, as shown above.

Knowing what the desired shape, size, and thickness of the gate layer, methods other than laser heating can be used to achieve at least some of the same results. For example, starting with a wafer of an intrinsic, p-type, or n-type silicon, one can ion implant dopants, oxygen, and nitrogen to form the needed n-type region or pocket, p-type region or pocket, PN junction, and oxide or nitride grooves or layers to submicron, nm, or angstrom precisions in thickness, location, dopant or oxide concentration profiles, and conductivity or resistivity characteristics. With the same starting wafer, thermal diffusion may also be used to achieve similar, but not exactly the same, results.

The U.S. Pat. No. 3,585,714 and application Ser. No. 154,300 disclose material-removing techniques, with automatic feed-back control, to form the microscopically precise grooves or regions. "Microscopic" in these prior patents means that dimensions, radii of curvatures, thickness, and their accuracies are in the range of 1 down to about 3 Angstroms or 1 atomic layer.

These material-removing techniques comprises mechanical, chemical, chemical-mechanical-polishing (CMP), and energetic or high-velocity particles bombardment with photons, electrons, ions, and protons. These methods are useful in the practice of this invention in the formation of extremely thin gate layers and tiny isolating grooves of any reasonable shape and size, at specific locations and accurate to submicrons down to about 3 angstroms or 1 atomic layer. In particular, the groove shapes may range from cylindrical, elliptical, and spherical, and conical (U.S. Pat. No. 3,585,714, col. 3, lines 70–72 and col. 9, line 6) in vertical, horizontal (application Ser. No. 154,300 FIG. 4), or inclined forms, and with flat, spherical, rounded, or conical bottoms. These disclosures anticipates the December 1973 IEEE paper by Sanders et al on V-grooves which are conical grooves first disclosed in Li's U.S. Pat. No. 3,430,109 in September 1965.

Foreign materials, such as O, N, Ge, Si, Ga, B, P, As, CVD Black Diamond, florinated silicate glass (FSG) with k=3.6, and spinned on low-k (k=2.7) SiLK organic material from Dow Chemical in use at IBM may be introduced for selected device applications into the newly formed grooves, or other selected locations by various processes including ion implantation (O, N, Ge, Si, Ga, B, P, and As), CVD, physical vapor deposition (PVD), spraying, spinning on, plating, . . . . Some of these added-on material may even form conductive (Al, Cu, Au, Pt, Pd) regions, layers, or leads in, e.g., semiconductors, 9-nm flash memory tunnel-oxide layer, silicon on insulator (SOI) region alongside bulk Si, superconductor, magnetic, and optoelectric devices. The conductive materials may be metals such as Al, Cu, W, Ta, Hf, Zr, and Ti. The material of the isolating regions, grooves, or high-k or low-k dielectric thin films may vary from oxides (of Si, Ge, AL, Hf, Zr, Ta, Ti), nitrides (of Si, Ti, Al), polysilicon, glass, silicides (Ti, Ta, Zr, Hf, Co, and Ni), and silicates (Hf, Zr).

In the formation of the new curved extra-thin gate layers, the silicon substrate may be, for example: 1) planarized with CMP process; 2) grooved with spherical conical or V-shaped with rounded cylindrical, or flat bottoms. See U.S. Pat. No. 3,585,714, column 3, lines 57–59 and column 9, line 6). mechanical polishers to form a horizontal concave spherical bowl or vertical deep and narrow hole; and 3) superficially surface nitrided and/or oxidized with ion-implantation.

The oxidation or nitridation can be controlled with precision feed-back control to achieve exact ultra-sensitive film thickness control down to angstroms. The feed-back control preferably is aided by real-time sensing with one or more precision electro-optic sensors to sense color, relectivity, emissivity, surface smoothness, and other thin-film optical characteristics. Softwares are available to fuse the sensed data in real time to achieve ultra-precision in the control of film thickness and optical, physical, and chemical properties.

The field insulating layer of the invention can be extremely thin, from 0.5 microns through 1 nm down to 3 Angstroms (i.e., one atomic layer). In fact, the thinner the better. A single atomic layer often suffices. Even randomly or intentionally added impurity atoms are useful to form single-electron devices (SED), single-hole device (SHD), or single-photon device (SPD). Because of the extreme thinness, the field layer is only curved only in one direction, i.e., horizontally. To make this layer curved vertically is not practical.

The gate insulating layer of the invention can be extremely thin, also from 0.5 microns through 1 nm, down to 3 Angstroms (i.e., 1 atomic layer). In fact, in many applications the thinner the better, particularly as to flexibility, integrity, and reliability. A single atomic or molecular layer often is the most useful. Because of this thinness, the field layer is only curved only in one direction, i.e., horizontally.

The new field insulation layer is preferably formed by ion implantation. As shown below, a wave form consisting preferably of multiple sinusoidal curved segments is more effective than both straight line and a simpler curved structures. The multiply wavy or curved structures can be formed by having a wavy movement of the substrate relative to the ion beam. Besides forming oxide or nitride structures, ion-implanting oxygen or nitrogen may also form insulating mixed oxide and nitride compounds other than of silicon or silicon oxide. Ion implantation may also be used to implant antidopants to compensate existing dopants for forming other useful, relatively intrinsic insulating materials for device applications. In these applications, p-type doping ions are implanted into n-type regions, while n-type doping ions are implanted into p-type regions to compensate the existing dopants leaving few free electron or hole carriers to improve electrical insulation.

As shown above, under an implanting voltage of one megavolt, oxygen and nitrogen ions can be introduced into silicon host to a depth of 1.7+/−0.13 and 1.87+/−0.12 microns, respectively. For modern CIS, 1.87 micron field insulating walls are sufficiently deep for practically all applications. Further, the implanted layer can be less than submicrons (e.g., down to a few atomic layers), have very sharp boundaries (to minimize chip estate), and can be accurate even to 3 Angstroms in depth, lateral dimensions, accuracies, and chemical composition profiles, as shown elsewhere.

Preferably, the field layer is made of a material having substantially the same chemical composition and, therefore, coefficient of thermal expansion as those of both the pocket and the substrate. This reduces thermal mismatch strains and stresses. Ideally, the field layer and pockets, and even the substrate, are of substantially the same density and material composition, except for several parts per million of foreign impurities, containing less than 20 down to several parts per million of uncompensated dopant impurity atoms.

To achieve full isolation, the insulating field groove must extend from the top of the pocket to below the silicon substrate layer. The groove bottom has a blunt, rather than a sharp, tip or bottom. There is no notch effect. The mismatch stresses between silicon and the insulating field layer vary gradually, not abruptly, near the rounded bottom, due to curvature effects. These stresses are smaller on a curved adjoining surface than on a flat adjoining surface, due to the new curvature-related strain-relief mechanism shown above. The mismatch stresses are zero in the lateral direction at the bottom if the bottom has a zero width, and minimum and symmetrically distributed when the rounded bottom is symmetrical with respect to a longitudinal bisecting plane thereof. Symmetrical stress distribution insures that both the left and right side of the device component fail with equal probability giving an overall enhanced device reliability. Proper focused laser processing produces the zero bottom width and symmetrical depression shape.

The insulating chain or panel $61$, $61'$, $61''$, . . . may not be atomic buy have appreciable width in a direction normally of the paper in FIG. 6, and also in depths extending horizontally toward the back of the paper so that single impurity-doped atom 66 now are semiconductor regions of substantial sizes. On the other hand, each of the semiconductor regions $62$, $63$, $64$, $65$, . . . may be only single atomic layers of p-type or n-type semiconductor material. Ion-implanted or atomic tweezer-picked chains or arrays of insulating material atoms 69 and dope atoms 66 may form the required single atomic layers $61$, $61'$, $61''$, . . . As shown above, atomic layers of various materials have been formed. The semiconductor regions, reduced to single atomic layers, may even be reduced in widths to be single atoms wide.

The atomic tweezer-formed semiconductor lines or regions $62$, $63$, $64$, and $65$, together with the mixed insulator and doped semiconductors chains $61$, $61'$, $61''$, . . . form not only light-sensing or light-detecting deices possibly down to only three or four atoms wide, but also CMOS devices of FIG. 4 useful for, e.g., logic processors or memories.

The solid optoelectric device thus reaches an ultimate miniaturization. These atomic sensors have the highest packing density. Thousands of them can form a 1-D linear array measuring only one micron in length. A one square micron 2-D array can contain one million of these sensors, transistors, or bits of information; while a cubic micron atomic IC particle contains one billion of these sensors, transistors, or bits of information.

Combining these atomic, molecular, or larger IC devices with the usual robots containing wheels, gears, rods, and columns, atomic electromechanical (AEM) systems can result. These AEM systems, varying in size from nano sizes down to atomic sizes of about 3–20 angstroms, can find many uses in various industries.

As an example, the atomic, or molecular AEM systems may be implanted, inhaled, or passed along the body of a human, animal, or virus, bacteria, or plant objects. Upon receiving a telecommunicated signal from the outside, the AEM system is directed to move the AEM system into a key position, or even into or a vital part or organ, such as the heart, brain, eye, kidney, stomach, liver, or bone joint, of the test object. The AEM system is directed to bond to the vital part or organ; and help perform real-time computerized, self-optimizing R&D experiments to study, e.g., biomedical or biochemical actions or reactions of the test object to a specific combination of medicines, as described in Li's self-optimizing patents cited elsewhere.

The real-time sensed input data in these automatic experiments may include mechanical (force, pressure), thermal (heat or phonon, temperature), electrical, chemical, and electro-optical data such as light (photons), electrons, and ions. Other real-time sensed data may come from brain wave studies, NMR images, blood pressure data, skin resistance tests, or sensed by the test objects themselves. The objects of these real-time computerized R&D may be, e.g., to determine reactions of test objects to specific drugs, chemical, virus, or physical and medical treatments; to develop new drugs or treatments by combinatorial screening; to achieve maximum physical and mental growth, to achieve optimal leaning or training; and to continuously maintain the best mental, physical, and physiological conditions for optimal sleeping, resting, reading, enjoying, working, and restoring or maintaining health.

Uses of the AEM systems in other industries are also numerous. An AEM system on a transportation vehicle makes it smart in achieving the optimal travel conditions under given environments of weather, road age, human constraints, rules and regulations, and vehicle conditions, for achieving the maximum passengers' comfort and minimum travel time and cost. The self-optimizing technology described above may also be used.

The invented processes uses the minimum number of device materials processed in simple processing equipment with simple procedures, but must control the critical thermal expansion and contraction in all directions between all components and during all device processing steps. Skilled person in the art recognize that the more complicated the device materials and production equipment and processes actually lowers the device yield but increases the final cost. The processes must also control the thermal expansion and contraction in all directions and during all device processing steps.

The following United States patents or application relating to solid state device of the present invention are made of record:

U.S. Patents of Shockley (U.S. Pat. No. 2,787,564), Gale (U.S. Pat. No. 2,434,894), Kellett et al (U.S. Pat. No. 3,341,754), Sibley (U.S. Pat. No. 3,326,176), and Gibbons (U.S. Pat. No. 3,563,809) on "Ion Implantation";

Peltzer's U.S. Pat. No. 3,648,125 on "Method of Fabricating Integrated Circuits";

Mark L. Gardner et al, U.S. Pat. No. 5,824,175 on "Semiconductor Circuit Device Having a Trilayer Gate Isolating Dielectric";

Li's U.S. Pat. No. 3,430,109 on "Solid-State Device with Differentially Expanded Junction Surfaces";

Li's U.S. Pat. No. 3,585,714 on "Method for Making Solid-State Devices";

Li's U.S. Pat. No. 4,690,714 on "Method of Making Solid State Devices";

Li's U.S. Pat. No. 4,946,800 on "Method of Making Solid-State Device Utilizing Dielectric Isolation Grooves";

Li's U.S. Pat. No. 6,599,781 on "Method of Making Solid State Device";

Li's U.S. Pat. No. 5,874,175 on "Ceramic Composite";

Li's U.S. Pat. No. 6,513,024 B1 on "Self-Optimization with Interactions";

Li's U.S. Pat. No. 6,144,954 on "Automatic Development of Computer Software";

Xi-wei Lin et al, Publication No. U.S. 2002/016484846 Al, Ser. No. 10/135,435 filed Apr. 9, 2002;

Li's application Ser. No. 154,300 filed Jun. 18, 1971 on "Method for Making Solid-State Device";

Li's application Ser. No. 08/483,937 filed on Jun. 7, 1995 on "Integrated Circuit Device";

Li's application Ser. No. 08/483,938 filed on Jun. 7, 1995 on "Method of Making Solid State Device"; and Li's application Ser. No. 09/670,874 filed on Sep. 27, 2000 on "Semiconductor Integrated Circuit Device".

I hereby incorporate all the above-cited patents and patent applications.

The invention, as described above, is not to be construed as limited to the particular forms disclosed herein, since these are to be regarded as illustrative rather than restrictive. For example, various combinations, equivalent substitutions, or other modifications of the preferred embodiments described herein are obviously possible in light of the description, without departing from the spirit of the invention. In particular, Ge, Si—Ge, InP, GaAs, GaN, InSb, dismond, and various III–V and II–VI compounds may, e.g., replace Si. Other useful materials include various semiconducting compounds consisting essentially of at least two elements respectively selected from two different groups of the periodic table.

Also, instead of silicon oxide or nitride, various electrically insulating or inert semiconductors, oxides, nitrides, intermetallic compounds, and other materials may be used to replace silicon oxide, oxynitrides, composite oxide/nitride, and high-dielectric (high-k) or low-k dielectrics for the gate, isolating region, or similar components in any solid-state device of this invention to achieve the same purpose as the gate layer or insulating region in MOS or CIS circuits.

Semiconductor integrated circuits such as MOS, CIS, bipolar, silicon-on-insulator, and silicon-germanium devices are covered in this invention. Other solid-state devices such as electro optical, various sensors and detectors, and electrooptomagnetic devices or circuits can also use the designs of this invention to achieve unique or improved performance and reliability, particularly as to heat, power, vibration, impact, and high accelerations and decelerations.

It is also to be understood that the following claims are intended to cover all of the generic and specific features of the invention herein described, and all statements of the scope of the invention which, as a matter of language, might be said to fall therebetween.

I claim:

1. A method of mass-producing a solid state device comprising:

supplying a solid-state material substrate having a top surface; and providing a solid state material layer no more than 40 Angstroms thick having at least one atomically smooth major surface, and positioned on the top surface of the substrate;

at least a lower surface of the solid state material layer being metallurgically bonded onto a selected portion of the top surface of the solid state material substrate, sufficiently uniformly and defect-freely to provide an acceptable device yield.

2. The method of claim 1 wherein the solid state material layer has at least two of the following features: a) having an atomically smoothed bottom surface; b) having a curved top surface; c) having an atomically smooth gate bottom surface; d) made of a solid state material purified during device processing; e) made of a single strengthened material; f) has uniformly oriented elongated and narrow grains; g) is stronger than unbonded device material; and h) less than two atomic layer thick.

3. The method as in claim 1 wherein the solid state material layer has a central bottom portion of zero width.

4. The method as in claim 1 wherein the solid state material layer has an accuracy of better than a single atom on a layer dimension selected from the group consisting of thickness, depth, curvature, shape, size, chemical composition profiling, and lateral location.

5. The method as in claim 1 where at least a portion of the solid state material layer is surfaced strengthened, whereby this surface-strengthened portion is stronger than the unbonded solid state material layer itself.

6. The method as in claim 1 where the solid state material layer is sufficiently thin and flexible to yield under stress preventing device failure.

7. The method as in claim 1 wherein the solid state material layer is a liquid-diffusion aged or burned-in solid state material.

8. The method as in claim 1 wherein the device has a thickness of substantially less than a micron forming a flexible thin-film integrated circuit device.

9. The method as in claim 1 wherein the solid state material layer has a curved major surface with a radius of curvature of less than 1 micron.

10. The method as in claim 1 wherein a material of the solid state material layer is at least one order of magnitude purer than the solid state material prior to the uniform metallurgical bonding.

11. The method as in claim 1 wherein the solid state material layer has an accuracy in thickness of two atomic or molecular layers.

12. The method as in claim 1 wherein the solid state materials layer comprises an ion implanted region containing a material selected from the group consisting of oxygen and nitrogen.

13. The method as in claim 1 including:
providing a solid state material substrate having a common top surface;
supplying a first and a second solid state material pockets; and
positioning a first and a second solid state material pockets adjacent to each other, but laterally separated by a gap, on the common top surface of the substrate;
the solid state material layer filling and bridging the gap between the two adjacent solid state material pockets.

14. The method as in claim 13 wherein:
at least a part of the substrate is a semiconductor of a first conductivity type; and
at least one of the semiconductor material pockets is of a second conductivity type forming at least one PN junction region where the part of the substrate contacts the at least one semiconductor material pocket.

15. The method as in claim 1 wherein the solid state material layer is selected from the group consisting of a single-material gate layer and a single-material field layer.

16. The method as in claim 1 wherein the substrate material is selected from the group consisting of Si, Ge, Si—Ge, InP, InSb, GaAs, SiC, InAs, superconductor, diamond, semiconductor material, intrinsic semiconductor material, substantially electrically insulating material, and substantially electrically conducting material, and mixture thereof.

17. The method as in claim 1 wherein the device is selected from the group consisting of metal-oxide-semiconductor (MOS) device, conductor-insulated-semiconductor (CIS) device, thin-film integrated circuit, flexible integrated circuit, electro optical device, single-electron device, single-hole device, single-carrier device, single-photon device, electrooptomagnetic deices and mixtures thereof.

18. The method as in claim 14 wherein:
the first and second semiconductor material pockets are respectively source and drain semiconductor pockets in a solid state device, and are separated by a gap from each other;
the solid state material layer is an electrically insulating gate layer filling and bridging the gap between the two pockets; and
the gate layer material has an atomically smooth surface on at least one of the top and major bottom surfaces thereof.

19. The method as in claim 13 wherein a major portion of each of the substrate, solid state material pockets, and solid state material layer consists essentially of a single semiconductor material doped to no more than 10 ppm of impurities thereby forming essentially a single-material device for resisting dynamic forces due to impacts, vibrations, and large and rapid accelerations and decelerations.

20. The method as in claim 1 including forming a PN junction region having a curved adjoining surface uniformly and defect-freely bonded onto the substrate to thereby reduce but not eliminate at least one of thermal mismatch strain and volume change strain,
the remaining residual strain on the curved adjoining surface of the PN junction region improving a selected device performance.

21. The method as in claim 14 wherein the at least one PN junction region has a bottom of zero width.

22. The method as in claim 1 wherein the solid state material layer is an electrically insulating, wavy and curved field layer containing a substance selected from the group consisting of oxygen and nitrogen.

23. The method as in claim 13 wherein:
the first and second solid state material pockets are respectively source and drain semiconductor pockets in a solid state device;
the solid state material layer is a single material gate layer; and
including a conductive gate electrode of an electrically conducting material to control flow of electronic carriers from the source to the drain.

24. The method as in claim 23 wherein:
the solid state material layer is a gate layer which is atomically smooth and defect-free on at least the bottom major surface thereof;
material of the gate layer being purest at the bottom major surface facing the substrate.

25. The method as in claim 1 wherein the solid state material layer has a shallow, highly activated doped region having a significantly greater dopant concentration than the thermal equilibrium phase-diagram value.

26. The method as in claim 1 wherein the solid state material layer is a field layer separating and electrically isolating device components from each other;
the field layer on a horizontal cross-section thereof has a plurality of curved arc sections capable of changing arc lengths thereof to relieve thermal mismatch strains on the device.

27. A method for mass-producing a solid state device comprising:
supplying a solid state material substrate;
providing a solid state material pocket positioned on a selected surface of the substrate; and
forming a solid state material layer less than 40 angstroms thick and metallurgically bonded onto a selected surface of the substrate;

said metallurgical bonding being so sufficiently uniform and defect-free as to provide a thermochemically stable bonding interface and to give a manageable device yield.

28. The method as in claim 27 wherein the solid state material layer is selected from the group consisting of a gate layer and a field layer.

29. The method as in claim 27 wherein the solid state device is selected from the group consisting of atomic IC device, molecular IC device, single-electron device, single-hole device, single-carrier device, and single photon device.

30. The method as in claim 27 wherein the solid state material layer has at least one of the following features: a) has a rounded bottom with zero width; b) has at least one atomically smooth major surface; c) bonded, atom to atom, onto the substrate; d) is purified by over one order of magnitude during at least a device processing step; e) is surface strengthened; f) is liquid-diffusion formed; g) is formed using ion-implantation; h) is of an electrical insulating material; i) is free of voids and microcracks visible at 1,000 times magnification.

31. The method as in claim 27 including employing a real-time self-optimizing method to control, to an accuracy of 20 angstroms, a selected dimension of said solid state material layer;
said selected dimension being selected from the group consisting of length, width, thickness, location, shape, radius of curvature, and chemical composition profiling.

32. The method as in claim 31 including real-time sensing an optoelectrical signal from the solid state material layer.

33. A method for mass-producing a solid state device comprising:
supplying a solid state material substrate having a first conductivity type:
supplying a solid state material pocket of a second conductivity type and contacting a top surface of the solid substrate;
providing a signal-translating, interfacial rectifying barrier region where the solid pocket contacts the solid substrate; and
forming an electrically insulating, solid state material layer metallurgically bonded onto selected portions of both the solid substrate and the solid pocket, sufficiently uniformly and defect-freely to achieve a manageable device yield;
there being no thermally and electrically insulating voids and microcracks to cause unstable electrical contacts, unwanted instabilities; leakage current; low breakdown voltage; boron penetration; and poor device performance, reproducibility, yield, reliability, and resistance to ambient particularly as to moisture.

34. The method as in claim 33 wherein the rectifying barrier region is of a type selected for the group consisting of a PN junction, a metal-oxide barrier, and a metal-semiconductor barrier, and has an accuracy of from nanometers to angstroms in a dimension or parameter selected from the group consisting of size, length, width, depth, thickness, accuracy, precision, curvature, shape, chemical composition profiling, and lateral location from a selected device component.

35. The method as in claim 33 including using an atomic engineering technique on at least one of the solid pocket and solid state material layer for achieving at least one of the following results: replacing failure-initiating oxide or silicon surface voids and microcracks with mechanical, thermal, and electrical strengtheners; material purification; dialectical enhancement; grain refinement; preferential grain orientation to facilitate thermal and electrical conduction; subgrains of substantially uniform width, size, and height; and functional composition grading to meet special service requirements;
wherein the rectifying barrier region is bonded onto both the solid substrate and solid pocket by an atom-to-atom bonding process to enhance mechanical, electrical, and thermochemical stability thereby improving device performances as to yield, cost, and miniaturization.

36. The method as in claim 33 for mass-producing an extremely small, high-precision solid state device at high yield but lost cost; and including:
atomically engineering the metallurgical bonding process between the different device materials to enhance mechanical, electrical, and thermochemical stability thereby improving device reliability on adhesion loss, texture, thermally or mechanically induced cracking, moisture adsorption, step coverage, and time-dependent behavior on thermal conductivity and breakdown voltage; and
minimizing thermal or volume expansion mismatch stresses on the device to improve device yield.

37. The method as in claim 33 including using atomic tweezers to sculpt, atom by atom or molecule by molecule, to form at least one of the solid state material substrate, pocket, and insulating layer;
forming the solid insulating layer as a gate layer having a gate length of less than 0.001 or 0.1 microns; and
controlling size of the gate layer down to less than 1 micron, with an accuracy of 1,000 angstroms down to 10 angstroms.

38. The method as in claim 33 wherein the solid state material layer is an isolating groove at a specific location on the device; and has a cylindrical, elliptical, spherical, or conical shape; with a flat, spherical, rounded, or conical bottom; and
the mass-produced solid-state device is used in an industry selected from the group consisting of wireless, satellite, home appliance, building, structure, transportation vehicle, equipment, defense, and home security system.

39. The method as in claim 33 including forming the solid insulating layer to have an elongated, substantially symmetrically rounded, insulating groove bottom having zero bottom width, whereby the thermal and dynamic mismatch stresses are zero in a lateral direction at the groove bottom;
the stresses being minimum and symmetrically distributed at the rounded bottom to preclude any weaker side so that the device is stronger overall.

40. The method as in claim 33 including using a fusion and resolidification process to maximize at least one material property selected from the group consisting of material purity, mechanical strength, crystallographic perfection, self-optimized oriented grains and subgrains, and maximum thermal and electrical conductance in a preselected preferred direction, to thereby provide reliably perfect contacts and device structure, continuity, and repeatability.

41. The method as in claim 33 including curving at least one of the solid pocket and the rectifying barrier region to have a radius of curvature selected from the group consisting of 10 angstroms and one micron; and
curving the solid insulating layer to have a radius of curvature selected from the group consisting of 1 cm, 0.1 cm, 0.01 cm, 0.001 cm, 1 micron, 0.1 micron, and down to one atom or molecule.

42. The method as in claim 33 including: forming the solid state material pocket to occupy a major portion of a top surface area of the device chip thereby achieving hitherto impossible, device miniaturization;
  only a minor portion of the top surface area being occupied by the solid state material layer and not by the solid state material pocket.

43. The method as in claim 33 including: locating bottom of the solid state material layer at less than a specified distance below a designated point in the interfacial rectifying barrier region;
  the specified distance being selected from the group consisting of one micron, 0.1 microns, significantly less than 0.1 microns, near zero, and between zero and 0.1 micron but closer to zero than 0.1 microns.

44. The method as in claim 33 including forming a subnanometer atomic or molecular electromechanical (A/MEM) system comprising the solid state device and selected electrotechnical components including at least a structure or package, a motor, a rod, a gear, and a wheel to form the A/MEM system; and
  applying the A/MEM system onto an object selected from the group consisting of human, animal, virus, bacteria, plant, equipment, and transportation vehicle;
  the applying step being selected form the group consisting of implanting, inhaling, and passing along at least a part of body of the object.

45. The method as in claim 44 including: telecommunicating a signal from outside of a body to the object;
  directing the A/MEM system to move into a key position relative to the object; and
  through another telecommunicated signal, directing the A/MEM system to perform a selected task on the object.

46. The method as in claim 45 in which the selected task comprises:
  real-time sensing an input data selected from the group consisting of mechanical force, pressure; heat, temperature; electrical, chemical, and electro-optical data; NMR images; brain waves; blood pressure; and skin resistance; and
  performing a real-time computerized, self-optimizing R&D experiment to study a specific biochemical or biomedical action or reaction of the object to a specific drug, virus, or biophysical and biomedical treatment for achieving an optimal mental, physical, and physiological condition selected form the group consisting of growth, learning, training, sleeping, resting, reading, enjoying, working, and restoring and maintaining health.

47. The method as in claim 46 wherein the object is a transportation vehicle, and the selected task comprises achieving optimal travel condition, maximum passengers' comfort, and minimum travel time and cost, under given environments of weather, traveling route, human constraints, rules and regulations, and vehicle conditions, at least one of the following: optimal travel condition, maximum passengers' comfort, and minimum travel time and cost.

48. The method as in claim 33 including selecting all materials of the solid substrate, solid pocket, and solid electrically insulating material region to have, except for ppm or ppb of impurities, the same composition, whereby all the materials have substantially the same coefficient of thermal expansion to minimize thermal mismatch stresses and also practically the same density to minimize dynamic stresses due to vibrations, impacts, and high accelerations and decelerations thereby forming an environmentally-resistant circuit device.

49. The method as in claim 33 including introducing a precise amount of foreign material into the device to form a new device region in at least a part of one of the solid substrate, solid pocket, and solid state material layer, thereby achieving an exact three-dimensional control in shape, size, location, and chemical composition of this new region;
  employing closed-loop feedback control to achieve a high accuracy of nanometers or angstroms in a dimension selected from the group consisting of size, length, width, depth or thickness, accuracy, precision, curvature, shape, chemical composition profiling, and lateral location from a selected device component; and
  using the rectifying barrier region being formed or processed as a sensing medium to sense a data selected from the group consisting of optical transparency, electrical resistance, temperature, thermal conductivities, leakage currents, and other electrooptical properties of the material of at least one of the solid substrate, pocket, and layer.

50. A method of mass-producing a solid state device of less than 0.1 micron in size, with nanometer accuracy, comprising:
  supplying a semiconductor material substrate of one conductivity type; and
  providing a semiconductor material pocket positioned on said substrate and having a conductivity type opposite to said one conductivity type thereby forming an electrically rectifying barrier between said substrate and said pocket;
  a lower surface of the semiconductor material pocket being chemically bonded, with a metallurgically graded seal, onto a selected portion of a top surface of said substrate, sufficiently uniformly and defect-freely to provide an acceptable device yield.

51. A method as in claim 50, comprising:
supplying said semiconductor material substrate and providing said semiconductor material pocket to have a common silicon semiconductor material;
  forming an insulating material layer below said semiconductor material pocket to form a gate layer thereunder; and
  choosing said insulating material layer primarily from a silicon nitride, and not a silicon dioxide, by selecting the proportion of said silicon nitride relative to the silicon dioxide from the following groups: about 100% silicon nitride; mostly of silicon nitride, and a majority of silicon nitride, to thereby improve performance of said device,
  wherein said improvement is a result of the fact that during in-situ oxide formation, the silicon host material undergoes a volume expansion corresponding to a linear expansion of 29.2% when oxidizing to silicon dioxide, while similar in-situ nitride formation, the silicon host when oxidizing to silicon nitride gives a corresponding linear expansion of only 4.3%, or 6.79 times smaller than that during similar oxidation from silicon to silicon dioxide.

52. A method as in claim 50, comprising: selecting at least one of said substrate and pocket to be of an intrinsic semiconductor material, thereby making said device more environmental friendly so that the entire device is more resistant to temperature, stress, impact, vibration, and high-gravity forces due to rapid acceleration and decelerations; and
  minimizing device reliability issues selected from the group consisting of adhesion loss, texture, thermally or mechanically induced cracking, moisture adsorption, step coverage, and time-dependent behavior on thermal conductivity and breakdown voltage.

53. A method as in claim 50, comprising: forming a closely controlled, thin insulating gate layer below said pocket to have a low defect density, to be less than 40 nm thick, and to be controlled to nanometer accuracy, wherein;

said insulating gate layer has a suitable dielectric constant and is compatible chemically with the material of at least one of said pocket to get the right interface, and layer material and structure; and forming said device as a one-dimensional, two-dimensional, or three-dimensional, atomic or molecular diode or transistor arrays of IC selectively operable in a single-electron, single-hole, single-carrier, single-photon, or single-particle mode.

54. A method as in claim 50, comprising: forming a closely controlled, thin insulating gate layer below said pocket using an ultra-shallow electrically rectifying barrier having a barrier depth of less than a value selected from the group consisting of 35 nm and 70 nm; and atomic engineering the thin gate layer to be defect-free, suitably high dielectric constant material and uniformly put down with required stability, interface state characteristics, and channel mobility, in a thin film form with a rounded bottom with a radius of curvature of a value selected from the group consisting of 1 micron, 0.1 microns, 0.01 microns, and 0.001 microns, in a vertical cross-section thereof, to tolerate subsequent processing and temperature cycling.

* * * * *